(12) United States Patent  (10) Patent No.: US 9,176,379 B2
Ichikawa et al.  (45) Date of Patent: *Nov. 3, 2015

(54) RESIST COMPOSITION AND METHOD FOR PRODUCING RESIST PATTERN

(75) Inventors: Koji Ichikawa, Osaka (JP); Takahiro Yasue, Osaka (JP); Tatsuro Masuyama, Osaka (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 19 days.

This patent is subject to a terminal disclaimer.

(21) Appl. No.: 13/441,205

(22) Filed: Apr. 6, 2012

(65) Prior Publication Data

US 2012/0264059 A1 Oct. 18, 2012

(30) Foreign Application Priority Data

Apr. 7, 2011 (JP) ................................. 2011-085017

(51) Int. Cl.
G03F 7/004 (2006.01)
G03F 7/027 (2006.01)
G03F 7/20 (2006.01)
G03F 7/039 (2006.01)

(52) U.S. Cl.
CPC ............ *G03F 7/0046* (2013.01); *G03F 7/0045* (2013.01); *G03F 7/027* (2013.01); *G03F 7/0397* (2013.01); *G03F 7/20* (2013.01); *G03F 7/2041* (2013.01)

(58) Field of Classification Search
None
See application file for complete search history.

(56) References Cited

U.S. PATENT DOCUMENTS

| 3,779,778 | A | 12/1973 | Smith et al. |
| 3,849,137 | A | 11/1974 | Barzynski et al. |
| 4,576,902 | A | 3/1986 | Saenger et al. |
| 4,822,716 | A | 4/1989 | Onishi et al. |
| 4,857,437 | A | 8/1989 | Banks et al. |
| 5,017,453 | A | 5/1991 | Onishi et al. |
| 5,073,476 | A | 12/1991 | Meier et al. |
| 5,198,520 | A | 3/1993 | Onishi et al. |
| 5,260,410 | A | 11/1993 | Schwalm |
| 5,453,341 | A | 9/1995 | Schwalm |
| 5,663,035 | A | 9/1997 | Masuda et al. |
| 7,304,175 | B2 | 12/2007 | Harada et al. |
| 7,439,006 | B2 | 10/2008 | Yoshida et al. |
| 7,579,132 | B2 | 8/2009 | Harada et al. |
| 7,612,217 | B2 | 11/2009 | Sakamoto et al. |
| 7,786,322 | B2 | 8/2010 | Yamaguchi et al. |
| 8,563,218 | B2 * | 10/2013 | Ichikawa et al. ........... 430/270.1 |
| 2002/0102491 | A1 | 8/2002 | Kodama et al. |
| 2006/0194982 | A1 | 8/2006 | Harada et al. |
| 2007/0078269 | A1 | 4/2007 | Harada et al. |
| 2007/0100096 | A1 | 5/2007 | Harada et al. |
| 2007/0122750 | A1 | 5/2007 | Yamaguchi et al. |
| 2008/0044738 | A1 | 2/2008 | Harada et al. |
| 2008/0076063 | A1 | 3/2008 | Yoshida et al. |
| 2008/0081925 | A1 | 4/2008 | Sakamoto et al. |
| 2008/0193874 | A1 | 8/2008 | Takata et al. |
| 2009/0208871 | A1 * | 8/2009 | Kawaue et al. ............ 430/285.1 |
| 2010/0081088 | A1 | 4/2010 | Kawaue et al. |
| 2010/0203446 | A1 | 8/2010 | Ichikawa et al. |
| 2010/0304293 | A1 * | 12/2010 | Ichikawa et al. ........... 430/270.1 |
| 2011/0039208 | A1 | 2/2011 | Hata et al. |
| 2011/0117495 | A1 | 5/2011 | Ichikawa et al. |
| 2011/0171576 | A1 | 7/2011 | Yamaguchi et al. |
| 2011/0200936 | A1 | 8/2011 | Ichikawa et al. |
| 2012/0028188 | A1 * | 2/2012 | Ichikawa et al. ........... 430/281.1 |
| 2013/0022924 | A1 * | 1/2013 | Ichikawa et al. ........... 430/281.1 |
| 2013/0065186 | A1 * | 3/2013 | Matsuda et al. .............. 430/325 |

FOREIGN PATENT DOCUMENTS

| DE | 39 14 407 A1 | 10/1990 |
| EP | 0 126 712 A1 | 11/1984 |
| JP | 55-164824 A | 12/1980 |
| JP | 62-69263 A | 3/1987 |
| JP | 62-153853 A | 7/1987 |
| JP | 63-26653 A | 2/1988 |
| JP | 63-146029 A | 6/1988 |
| JP | 63-146038 A | 6/1988 |
| JP | 63-163452 A | 7/1988 |
| JP | 7-333851 A | 12/1995 |
| JP | 2006-257078 A | 9/2006 |

(Continued)

OTHER PUBLICATIONS

Luis et al., "Non Concerted Pathways in the Generation of Dehydroarenes by Thermal Decomposition of Diaryliodonium Carboxylates", Tetrahedron, vol. 45, No. 19, 1989, pp. 6281-6296.

*Primary Examiner* — Cynthia H Kelly
*Assistant Examiner* — Alyssa L Cepluch
(74) *Attorney, Agent, or Firm* — Birch, Stewart, Kolasch & Birch, LLP

(57) ABSTRACT

A resist composition includes (A) a resin being insoluble or poorly soluble in alkali aqueous solution, but becoming soluble in an alkali aqueous solution by the action of an acid, (B) an acid generator having a structure to be cleaved by the action of an alkaline developer, and (C) a compound represented by the formula (I),

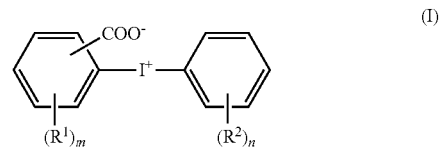

wherein $R^1$ and $R^2$ in each occurrence independently represent a $C_1$ to $C_{12}$ hydrocarbon group, a $C_1$ to $C_6$ alkoxyl group, a $C_2$ to $C_7$ acyl group, a $C_2$ to $C_7$ acyloxy group, a $C_2$ to $C_7$ alkoxycarbonyl group, a nitro group or a halogen atom; m and n independently represent an integer of 0 to 4.

4 Claims, No Drawings

(56) References Cited

FOREIGN PATENT DOCUMENTS

| | | |
|---|---|---|
| JP | 2007-161707 A | 6/2007 |
| JP | 2008-13551 A | 1/2008 |
| JP | 2008-69146 A | 3/2008 |
| JP | 2008-127367 A | 6/2008 |
| JP | 2009-19146 A | 1/2009 |
| JP | 2009-145408 A | 7/2009 |
| JP | 2009-229603 A | 10/2009 |
| JP | 2010-111660 A | 5/2010 |
| JP | 2010-152341 A | 7/2010 |
| JP | 2010-204646 A | 9/2010 |
| JP | 2012-6907 A | 1/2012 |
| WO | WO 2011115138 A1 * | 9/2011 |

* cited by examiner

RESIST COMPOSITION AND METHOD FOR PRODUCING RESIST PATTERN

CROSS-REFERENCE TO RELATED APPLICATIONS

This application claims priority to Japanese Application No. 2011-85017 filed on Apr. 7, 2011. The entire disclosures of Japanese Application No. 2011-85017 is incorporated hereinto by reference.

BACKGROUND OF THE INVENTION

1. Field of the Invention

The present invention relates to a resist composition and a method for producing resist pattern.

2. Background Information

A resist composition which contains a resin, an acid generator and a quencher containing 2,6-diisopropylaniline is described in Patent document of JP-2006-257078A.

However, with the conventional resist composition, the critical dimension uniformity (CDU) of the obtained resist pattern may be not always satisfied with.

SUMMARY OF THE INVENTION

The present invention provides following inventions of <1> to <5>.

<1> A resist composition having;

(A) a resin being insoluble or poorly soluble in alkali aqueous solution, but becoming soluble in an alkali aqueous solution by the action of an acid, (B) an acid generator having a structure to be cleaved by the action of an alkaline developer, and (C) a compound represented by the formula (I),

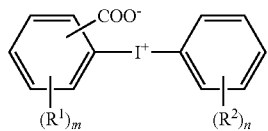

(I)

wherein $R^1$ and $R^2$ in each occurrence independently represent a $C_1$ to $C_{12}$ hydrocarbon group, a $C_1$ to $C_6$ alkoxyl group, a $C_2$ to $C_7$ acyl group, a $C_2$ to $C_7$ acyloxy group, a $C_2$ to $C_7$ alkoxycarbonyl group, a nitro group or a halogen atom;

m and n independently represent an integer of 0 to 4.

<2> The resist composition according to <1>, wherein the structure to be cleaved by the action of an alkaline developer is a group represented by the formula (Ba) or a group represented by the formula (Bb);

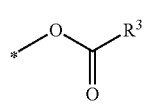

(Ba)

wherein $R^3$ represents a $C_1$ to $C_6$ alkyl group having a fluorine atom;

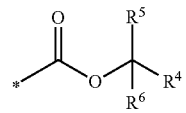

(Bb)

wherein $R^4$ represents a $C_1$ to $C_6$ alkyl group having a fluorine atom; and $R^5$ and $R^6$ independently represent a hydrogen atom or a fluorine atom.

<3> The resist composition according to <1> or <2>, wherein the acid generator (B) is an acid generator represented by the formula (II-a) or an acid generator represented by the formula (II-b);

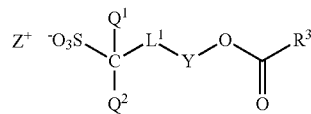

(II-a)

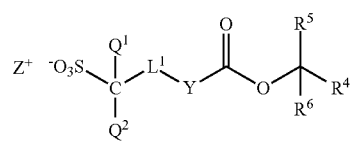

(II-b)

wherein $Q^1$ and $Q^2$ independently represent a fluorine atom or a $C_1$ to $C_6$ perfluoroalkyl group;

$L^1$ represents a single bond or a $C_1$ to $C_{17}$ alkanediyl group, and one or more —$CH_2$— contained in the alkanediyl group may be replaced by —O— or —CO—;

Y represents a $C_3$ to $C_{18}$ divalent alicyclic hydrocarbon group, and one or more —$CH_2$— contained in the alicyclic hydrocarbon group may be replaced by —O— or —CO;

$R^3$ represents a $C_1$ to $C_6$ alkyl group having a fluorine atom;

$R^4$ represents a $C_1$ to $C_6$ alkyl group having a fluorine atom;

$R^5$ and $R^6$ independently represent a hydrogen atom or a fluorine atom; and $Z^+$ represents an organic cation.

<4> The resist composition according to any one of <1> to <3>, which further comprises a solvent.

<5> A method for producing a resist pattern comprising steps of;

(1) applying the resist composition of any one of <1> to <4> onto a substrate;

(2) drying the applied composition to form a composition layer;

(3) exposing the composition layer;

(4) heating the exposed composition layer, and (5) developing the heated composition layer.

DETAILED DESCRIPTION OF THE PREFERRED EMBODIMENTS

"(Meth)acrylic monomer" means at least one monomer having a structure of "$CH_2$=CH—CO—" or "$CH_2$=C($CH_3$)—CO—", as well as "(meth)acrylate" and "(meth)acrylic acid" mean "at least one acrylate or methacrylate" and "at least one acrylic acid or methacrylic acid," respectively.

<Resist Composition>

The resist composition of the present invention contains;

(A) a resin (hereinafter is sometimes referred to as "resin (A)"), (B) an acid generator having a structure to be cleaved by the action of an alkaline developer (hereinafter is sometimes referred to as "acid generator (B)") and (D) a compound represented by the formula (I), Further, the present resist composition preferably contains a solvent (hereinafter is sometimes referred to as "solvent (E)"), as needed.

<Resin (A)>

The resin (A) is a resin having properties which is insoluble or poorly soluble in alkali aqueous solution but becomes soluble in an alkali aqueous solution by the action of an acid. Here "a resin having properties which is insoluble or poorly soluble in alkali aqueous solution but becomes soluble in an alkali aqueous solution by the action of an acid" means a resin which has an acid labile group and is insoluble or poorly soluble in aqueous alkali solution before contact with the acid, and becomes soluble in aqueous alkali solution after contact with an acid.

Therefore, the resin (A) can be produced by polymerizing at least one monomer having an acid labile group described below (hereinafter is sometimes referred to as "acid labile monomer (a1)").

The resin (A) may also have a structural unit derived from an acid stable monomer and/or a structural unit derived from a known monomer in this field as long as the resin (A) has the properties described above.

<Acid Labile Monomer (a1)>

The "acid labile group" means a group which has an elimination group and in which the elimination group is detached by contacting with an acid resulting in forming a hydrophilic group such as a hydroxy or carboxy group. Examples of the acid labile group include a group represented by the formula (1) and a group represented by the formula (2). Hereinafter a group represented by the formula (1) is sometimes referred to as an "acid labile group (1)", and a group represented by the formula (2) is sometimes referred to as an "acid labile group (2)".

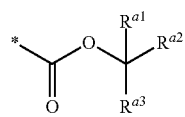
(1)

wherein $R^{a1}$ to $R^{a3}$ independently represent a $C_1$ to $C_8$ alkyl group or a $C_3$ to $C_{20}$ alicyclic hydrocarbon group, or $R^{a1}$ and $R^{a2}$ may be bonded together to form a $C_2$ to $C_{20}$ divalent hydrocarbon group, * represents a bond. In particular, the bond here represents a bonding site (the similar shall apply hereinafter for "bond").

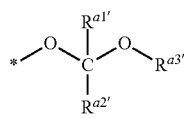
(2)

wherein $R^{a1'}$ and $R^{a2'}$ independently represent a hydrogen atom or a $C_1$ to $C_{12}$ hydrocarbon group, $R^{a3'}$ represents a $C_1$ to $C_{20}$ hydrocarbon group, or $R^{a2'}$ and $R^{a3'}$ may be bonded together to form a divalent $C_2$ to $C_{20}$ hydrocarbon group, and one or more —$CH_2$— contained in the hydrocarbon group or the divalent hydrocarbon group may be replaced by —O— or —S—, * represents a bond.

Examples of the alkyl group of $R^{a1}$ to $R^{a3}$ include methyl, ethyl, propyl, butyl, pentyl and hexyl groups.

Examples of the alicyclic hydrocarbon group of $R^{a1}$ to $R^{a3}$ include monocyclic groups such as cyclopentyl, cyclohexyl, methylcyclohexyl, dimethylcyclohexyl, cycloheptyl, cyclooctyl groups; and polycyclic hydrocarbon groups such as decahydronaphtyl, adamantyl, norbornyl (i.e., bicyclo [2.2.1]hexyl), and methyl norbornyl groups as well as groups below.

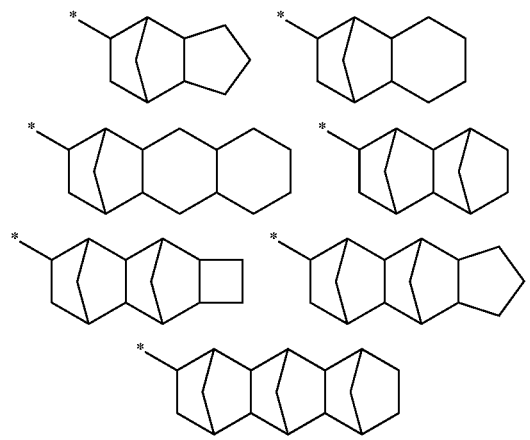

The alicyclic hydrocarbon group of $R^{a1}$ to $R^{a3}$ preferably has 3 to 16 carbon atoms.

When $R^{a1}$ and $R^{a2}$ is bonded together to form a $C_2$ to $C_{20}$ divalent hydrocarbon group, examples of the group —$C(R^{a1})(R^{a2})(R^{a3})$— include groups below. The divalent hydrocarbon group preferably has 3 to 12 carbon atoms.

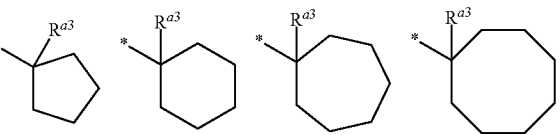

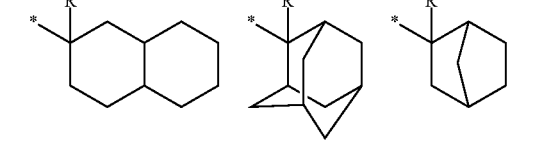

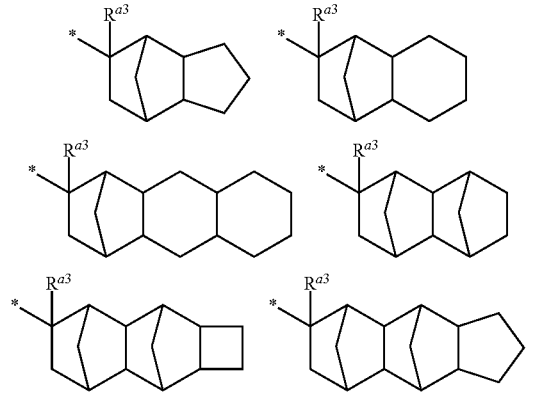

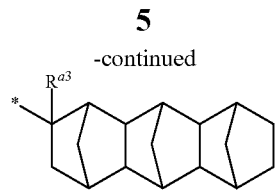

Specific examples of the acid labile group (1) include, for example, 1,1-dialkylalkoxycarbonyl group (a group in which $R^{a1}$ to $R^{a3}$ are alkyl groups, preferably tert-butoxycarbonyl group, in the formula (1)), 2-alkyladamantane-2-yloxycarbonyl group (a group in which $R^{a1}$, $R^{a2}$ and a carbon atom form adamantyl group, and $R^{a3}$ is alkyl group, in the formula (1)), and 1-(adamantine-1-yl)-1-alkylalkoxycarbonyl group (a group in which $R^{a1}$ and $R^{a2}$ are alkyl group, and $R^{a3}$ is adamantyl group, in the formula (1)).

The hydrocarbon group of $R^{a1'}$ to $R^{a3'}$ includes any of an alkyl group, an alicyclic hydrocarbon group and an aromatic hydrocarbon group.

Examples of the alkyl group and the alicyclic hydrocarbon group are the same examples as described above.

Examples of the aromatic hydrocarbon group include an aryl group such as phenyl, naphthyl, anthryl, p-methylphenyl, p-tert-butylphenyl, p-adamantylphenyl, tolyl, xylyl, cumenyl, mesityl, biphenyl, phenanthryl, 2,6-diethylphenyl and 2-methyl-6-ethylphenyl groups.

Examples of the divalent hydrocarbon group which is formed by bonding with $R^{a2'}$ and $R^{a3'}$ include groups in which one hydrogen atom in the hydrocarbon group as described above is removed.

At least one of $R^{a1'}$ and $R^{a2'}$ is preferably a hydrogen atom.

Specific examples of the acid labile group (2) include a group below.

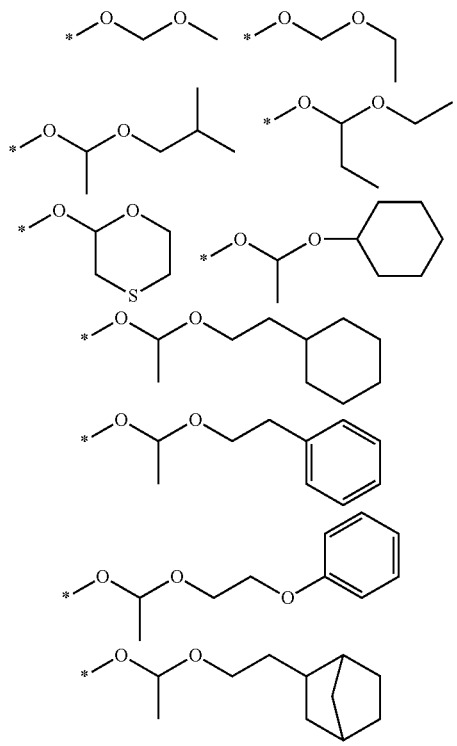

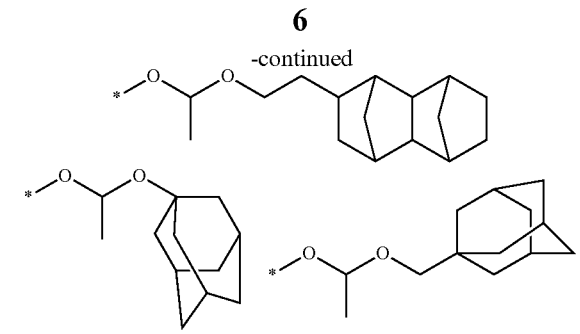

The acid labile monomer (a1) is preferably a monomer having an acid labile group and a carbon-carbon double bond, and more preferably a (meth)acrylic monomer having the acid labile group. In particular, the acid labile monomer (a1) is preferably a monomer having the acid labile group (1) and/or the acid labile group (2), and a carbon-carbon double bond, and more preferably a (meth)acrylic monomer having the acid labile group (1).

Among the (meth)acrylic monomer having an acid labile group, it is preferably a monomer having a $C_5$ to $C_{20}$ alicyclic hydrocarbon group. When a resin which can be obtained by polymerizing monomers having bulky structure such as the alicyclic hydrocarbon group is used, the resist composition having excellent resolution tends to be obtained during the production of a resist pattern.

Examples of a structural unit derived from the (meth)acrylic monomer having the acid labile group and a carbon-carbon double bond preferably include structural units represented by the formula (a1-1) and the formula (a1-2) below. Hereinafter the structural unit represented by the formula (a1-1) and the structural unit represented by the formula (a1-2) are sometimes referred to as "structural unit (a1-1)" and "structural unit (a1-2)"), respectively, and monomers introducing the structural unit (a1-1) and the structural unit (a1-2) are sometimes referred to as "monomer (a1-1)" and "monomer (a1-2)"), respectively. These may be used as a single monomer or as a combination of two or more monomers.

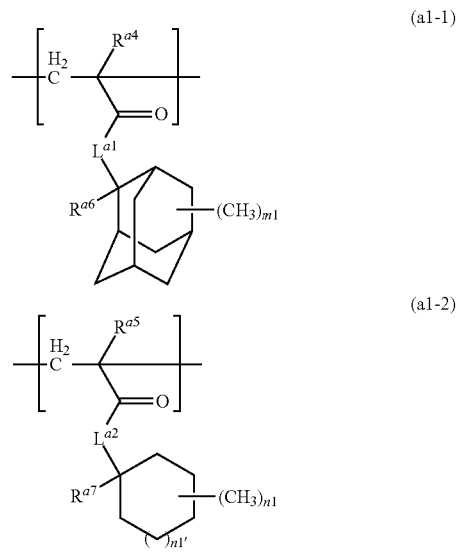

wherein $L^{a1}$ and $L^{a2}$ independently represent *—O— or *—O—$(CH_2)_{k1}$—CO—O—, k1 represents an integer of 1 to 7, * represents a bond to the carbonyl group;

$R^{a4}$ and $R^{a5}$ independently represent a hydrogen atom or a methyl group;

$R^{a6}$ and $R^{a7}$ independently represent a $C_1$ to $C_8$ alkyl group or a $C_3$ to $C_{10}$ alicyclic hydrocarbon group;

m1 represents an integer 0 to 14;

n1 represents an integer 0 to 10; and n1' represents an integer 0 to 3.

In the formula (a1-1) and the formula (a1-2), $L^{a1}$ and $L^{a2}$ are preferably *—O— or *—O—$(CH_2)_{k1'}$—CO—O— and more preferably *—O—, here k1' represents an integer of 1 to 4 and more preferably 1.

$R^{a4}$ and $R^{a5}$ are preferably a methyl group.

Examples of the alkyl group of $R^{a6}$ and $R^{a7}$ include methyl, ethyl, propyl, butyl, pentyl, hexyl and octyl groups. Among these, the alkyl group of $R^{a6}$ and $R^{a7}$ is preferably a $C_1$ to $C_6$ alkyl group, Examples of the alicyclic group of $R^{a6}$ and $R^{a7}$ include monocyclic hydrocarbon groups such as cyclopentyl, cyclohexyl, methylcyclohexyl, dimethylcyclohexyl, cycloheptyl, cyclooctyl groups; and polycyclic hydrocarbon groups such as decahydronaphtyl, adamantyl, norbornyl (i.e., bicyclo[2.2.1]hexyl), and methyl norbornyl groups as well as groups below. Among these, the alicyclic group of $R^{a6}$ and $R^{a7}$ is preferably a $C_3$ to $C_8$ alicyclic hydrocarbon group, and more preferably a $C_3$ to $C_6$ alicyclic hydrocarbon group.

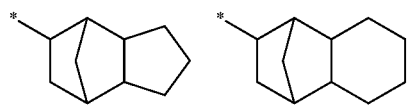

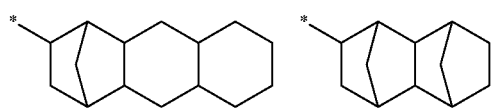

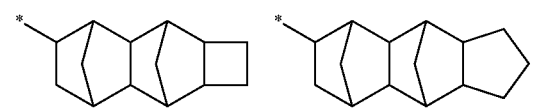

m1 is preferably an integer of 0 to 3, and more preferably 0 or 1.

n1 is preferably an integer of 0 to 3, and more preferably 0 or 1.

n1' is preferably 0 or 1, and more preferably 1.

Examples of the monomer (a1-1) include monomers described in JP 2010-204646A. Among these, the monomers are preferably monomers represented by the formula (a1-1-1) to the formula (a1-1-8), and more preferably monomers represented by the formula (a1-1-1) to the formula (a1-1-4) below.

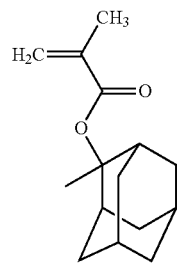
(a1-1-1)

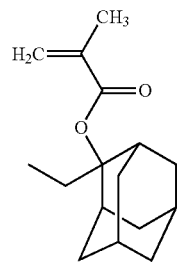
(a1-1-2)

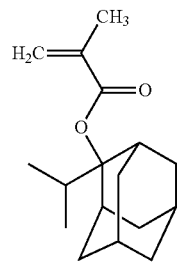
(a1-1-3)

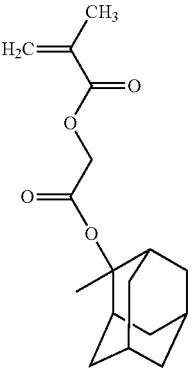
(a1-1-4)

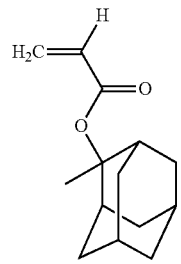
(a1-1-5)

(a1-1-6)
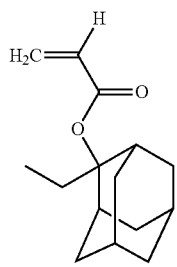

(a1-1-7)
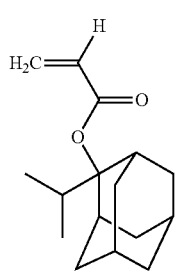

(a1-1-8)
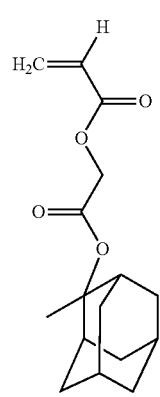

Examples of the monomer (a1-2) include 1-ethylcyclopentane-1-yl (meth)acrylate, 1-ethylcyclohexane-1-yl (meth)acrylate, 1-ethylcycloheptane-1-yl (meth)acrylate, 1-methylcyclopentane-1-yl (meth)acrylate and 1-isopropylcyclopentane-1-yl (meth)acrylate. Among these, the monomers are preferably monomers represented by the formula (a1-2-1) to the formula (a1-2-12), and more preferably monomers represented by the formula (a1-2-3), the formula (a1-2-4), the formula (a1-2-9) and the formula (a1-2-10), and still more preferably monomer represented by the formula (a1-2-3) and the formula (a1-2-9) below.

(a1-2-1)
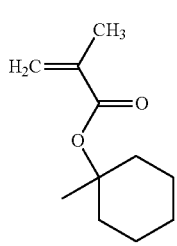

(a1-2-2)
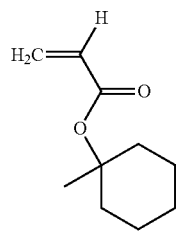

(a1-2-3)
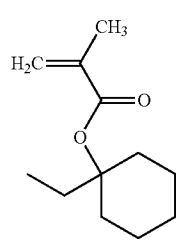

(a1-2-4)
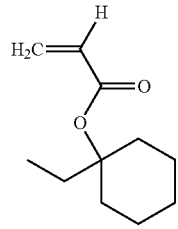

(a1-2-5)
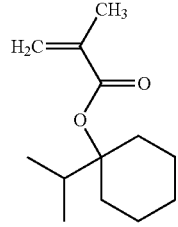

(a1-2-6)
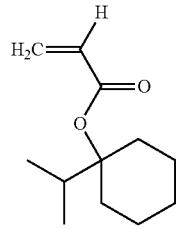

(a1-2-7)
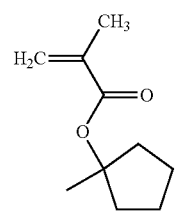

(a1-2-8)
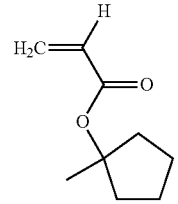

-continued

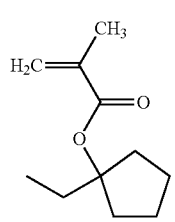
(a1-2-9)

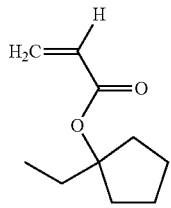
(a1-2-10)

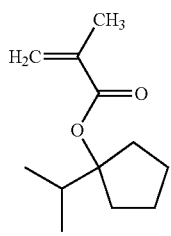
(a1-2-11)

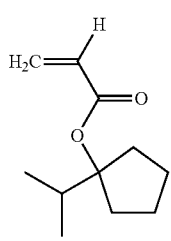
(a1-2-12)

When the resin (A) contains the structural unit (a1-1) and/or the structural unit (a1-2), the total proportion thereof is generally 10 to 95 mol %, preferably 15 to 90 mol %, more preferably 20 to 85 mol %, with respect to the total structural units (100 mol %) of the resin (A).

Examples of a monomer having an acid-labile group (2) and a carbon-carbon double bond include a monomer represented by the formula (a1-5). Hereinafter, such monomer is sometimes referred to as "monomer (a1-5)". When the resin (A) has the structural unit derived from the monomer (a1-5), a resist pattern tends to be obtained with less defects.

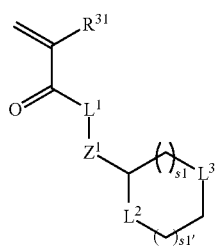
(a1-5)

wherein $R^{31}$ represents a hydrogen atom, a halogen atom or a $C_1$ to $C_6$ alkyl group that optionally has a halogen atom;

$L^1$ represents *—O—, *—S— or *—O—$(CH_2)_{k1}$—CO—O—, k1 represents an integer of 1 to 7, * represents a bond to the carbonyl group (—CO—);

$L^2$ and $L^3$ independently represent *—O— or *—S—;

s1 represents an integer of 0 to 4;

s1' represents an integer of 0 to 4;

$Z^1$ represents a single bond or a $C_1$ to $C_6$ alkanediyl group, and one or more —$CH_2$— contained in the alkanediyl group may be replaced by —O— or —CO—.

In the formula (a1-5), $R^{31}$ is preferably a hydrogen atom, a methyl group or trifluoromethyl group;

$L^1$ is preferably —O—;

$L^2$ and $L^3$ are independently preferably *—O— or *—S—, and more preferably —O— for one and —S— for another;

s1 is preferably 1;

s1' is preferably an integer of 0 to 2;

$Z^1$ is preferably a single bond or —$CH_2$—CO—O—.

Examples of the compound represented by the formula (a1-5) include compounds below.

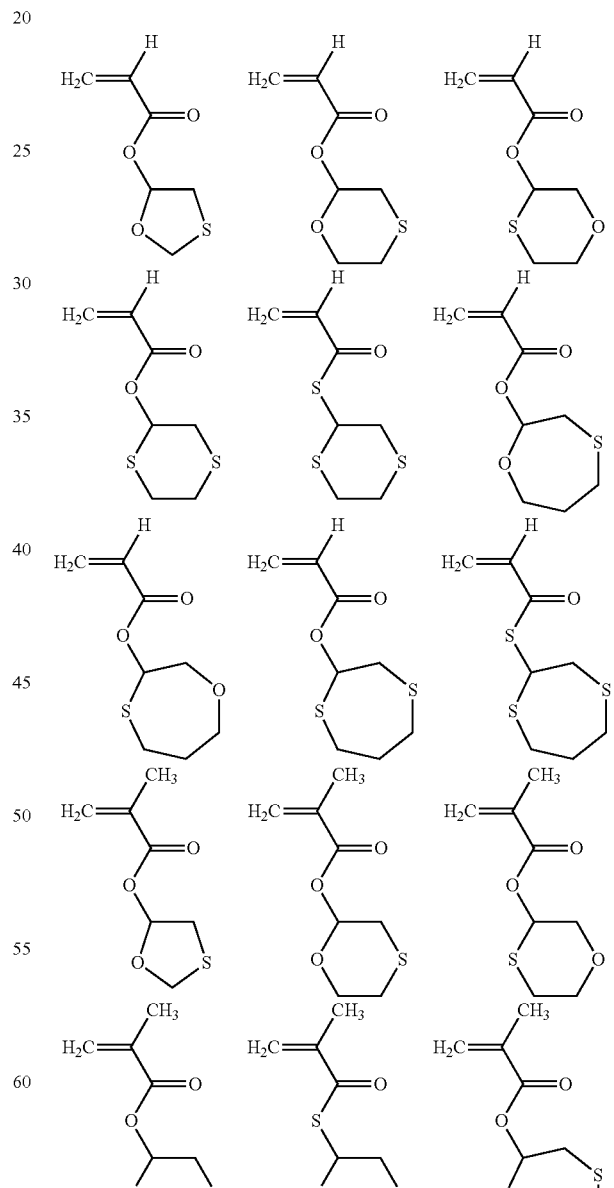

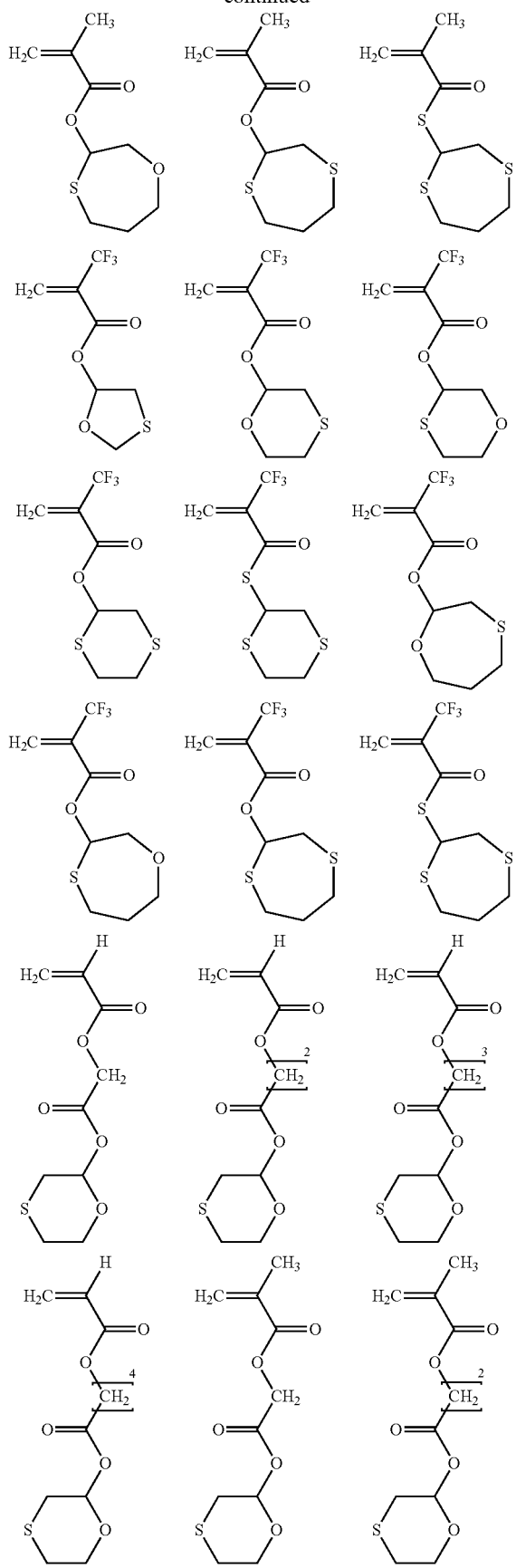
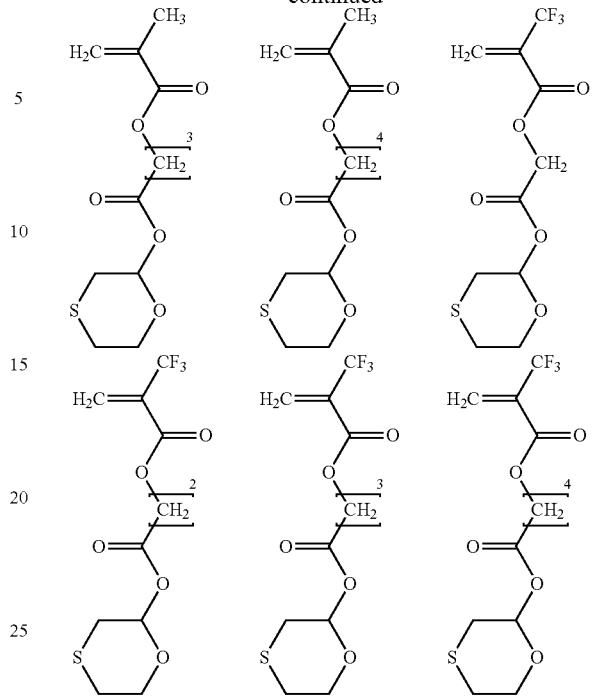

When the resin (A) contains the structural unit derived from the monomer (a1-5), the proportion thereof is generally 1 to 50 mol %, preferably 3 to 45 mol %, and more preferably 5 to 40 mol %, with respect to the total structural units (100 mol %) constituting the resin (A).

<Acid Stable Monomer>

The resin (A) is preferably a copolymer in which monomers not having the acid labile group are used in addition to the monomer (a1). Hereinafter the monomer not having the acid labile group is sometimes referred to as "acid stable monomer".

As the acid stable monomer, a monomer having a hydroxy group or a lactone ring is preferable. When a resin containing the structural unit derived from a monomer having hydroxy group (hereinafter such acid stable monomer is sometimes referred to as "acid stable monomer (a2)") or a acid stable monomer having a lactone ring (hereinafter such acid stable monomer is sometimes referred to as "acid stable monomer (a3)") is used, the adhesiveness of resist to a substrate and resolution of resist pattern tend to be improved.

<Acid Stable Monomer (a2)>

The acid stable monomer (a2), which has the hydroxy group, is preferably selected depending on the kinds of an exposure light source at producing the resist pattern.

When KrF excimer laser lithography (248 nm), or high-energy irradiation such as electron beam or EUV is used for the resist composition, using the acid stable monomer having a phenolic hydroxy group such as hydroxystyrene as the acid stable monomer (a2) is preferable.

When ArF excimer laser lithography (193 nm), i.e., short wavelength excimer laser lithography is used, using the acid stable monomer having a hydroxy adamantyl group represented by the formula (a2-1) as the acid stable monomer (a2) is preferable.

The acid stable monomer (a2) having the hydroxy group may be used as a single monomer or as a combination of two or more monomers.

Examples of the acid stable monomer having hydroxy adamantyl include the monomer represented by the formula (a2-1).

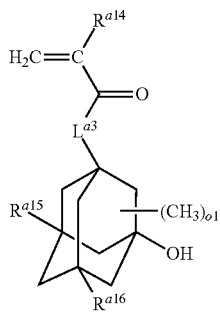

(a2-1)

wherein Las represents —O— or *—O—(CH$_2$)$_{k2}$—CO—O—;

k2 represents an integer of 1 to 7;

represents a bind to —CO—;

$R^{a14}$ represents a hydrogen atom or a methyl group;

$R^{a15}$ and $R^{a16}$ independently represent a hydrogen atom, a methyl group or a hydroxy group;

o1 represents an integer of 0 to 10.

In the formula (a2-1), Las is preferably —O—, —O—(CH$_2$)$_{f1}$—CO—O—, here f1 represents an integer of 1 to 4, and more preferably —O—.

$R^{a14}$ is preferably a methyl group.

$R^{a15}$ is preferably a hydrogen atom.

$R^{a16}$ is preferably a hydrogen atom or a hydroxy group.

o1 is preferably an integer of 0 to 3, and more preferably an integer of 0 or 1.

Examples of the acid stable monomer (a2-1) include monomers described in JP 2010-204646A. Among these, the monomers are preferably monomers represented by the formula (a2-1-1) to the formula (a2-1-6), more preferably monomers represented by the formula (a2-1-1) to the formula (a2-1-4), and still more preferably monomers represented by the formula (a2-1-1) and the formula (a2-1-3) below.

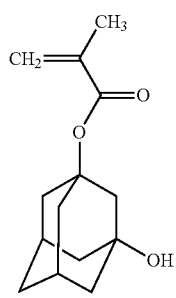

(a2-1-1)

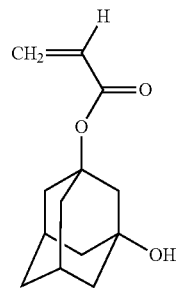

(a2-1-2)

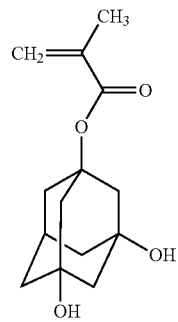

(a2-1-3)

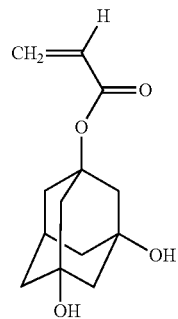

(a2-1-4)

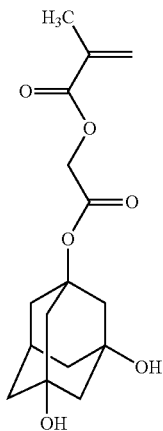

(a2-1-5)

(a2-1-6)

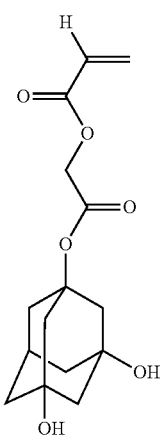

When the resin (A) contains the acid stable structural unit derived from the monomer (a2-1), the proportion thereof is generally 3 to 45 mol %, preferably 5 to 40 mol %, more preferably 5 to 35 mol %, and still more preferably 5 to 20 mol %, with respect to the total structural units (100 mol %) constituting the resin (A).

<Acid Stable Monomer (a3)>

The lactone ring included in the acid stable monomer (a3) may be a monocyclic compound such as β-propiolactone ring, γ-butyrolactone, δ-valerolactone, or a condensed ring with monocyclic lactone ring and other ring. Among these, γ-butyrolactone, and condensed ring with γ-butyrolactone and other ring are preferable.

Examples of the acid stable monomer (a3) having the lactone ring include monomers represented by the formula (a3-1), the formula (a3-2) and the formula (a3-3). These monomers may be used as a single monomer or as a combination of two or more monomers.

(a3-1)

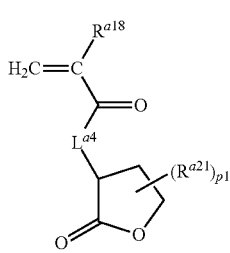

(a3-2)

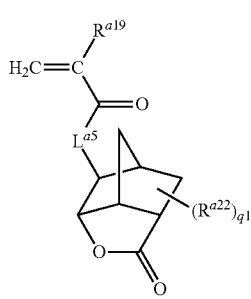

(a3-3)

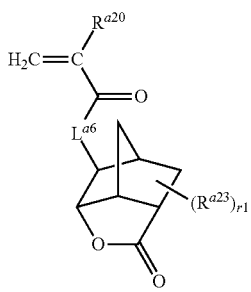

wherein $L^{a4}$ to $L^{a6}$ independently represent —O— or *—O—$(CH_2)_{k3}$—CO—O—;

k3 represents an integer of 1 to 7, * represents a bind to —CO—;

$R^{a18}$ to $R^{a20}$ independently represent a hydrogen atom or a methyl group;

$R^{a21}$ in each occurrence represents a $C_1$ to $C_4$ alkyl group;

p1 represents an integer of 0 to 5;

$R^{a22}$ to $R^{a23}$ in each occurrence independently represent a carboxyl group, cyano group, and a $C_1$ to $C_4$ alkyl group;

q1 and r1 independently represent an integer of 0 to 3.

Examples of the alkyl group of $R^{a21}$ and $R^{a23}$ include methyl, ethyl, propyl, isopropyl, n-butyl, tert-butyl and sec-butyl groups.

In the formulae (a3-1) to (a3-3), $L^{a4}$ to $L^{a6}$ include the same group as described in $L^{a3}$ above, and are independently preferably —O—, *—O—$(CH_2)_{k3'}$—CO—O—, here k3' represents an integer of 1 to 4 (preferably 1), and more preferably —O—;

$R^{a18}$ to $R^{a21}$ are independently preferably a methyl group.

$R^{a22}$ and $R^{a23}$ are independently preferably a carboxyl group, cyano group or methyl group;

p1 to r1 are independently preferably an integer of 0 to 2, and more preferably an integer of 0 or 1.

Examples of the monomer (a3) include monomers described in JP 2010-204646A. Among these, the monomers are preferably monomers represented by the formula (a3-1-1) to the formula (a3-1-4), the formula (a3-2-1) to the formula (a3-2-4), the formula (a3-3-1) to the formula (a3-3-4), more preferably monomers represented by the formula (a3-1-1) to the formula (a3-1-2), the formula (a3-2-3) to the formula (a3-2-4), and still more preferably monomers represented by the formula (a3-1-1) and the formula (a3-2-3) below.

(a3-1-1)

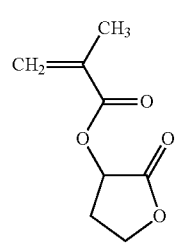

(a3-1-2)
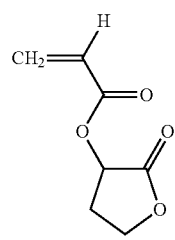
(a3-1-3)
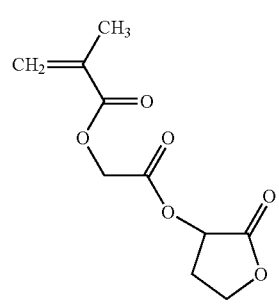
(a3-1-4)
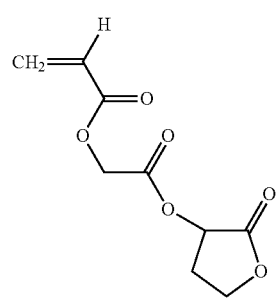
(a3-2-1)
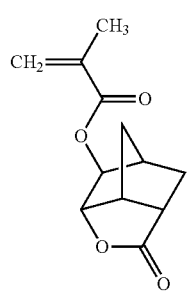
(a3-2-2)
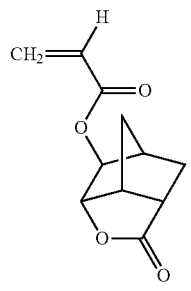
(a3-2-3)
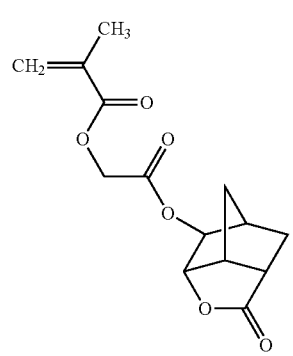
(a3-2-4)
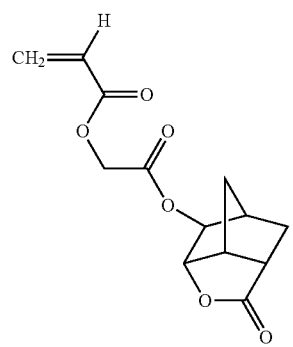
(a3-3-1)
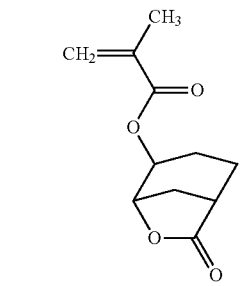
(a3-3-2)
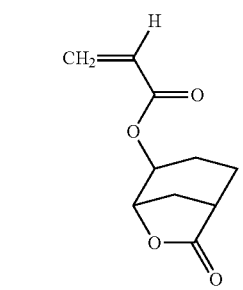
(a3-3-3)
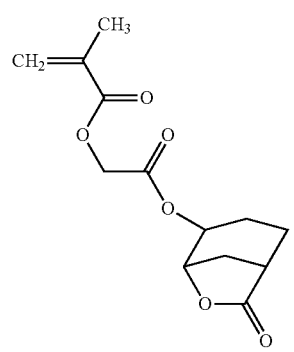

(a3-3-4)

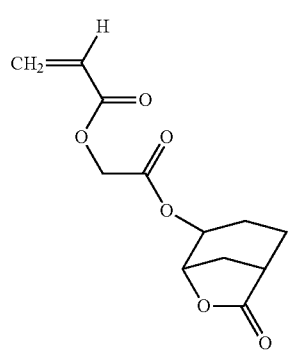

When the resin (A) contains the structural units derived from the acid stable monomer (a3) having the lactone ring, the total proportion thereof is preferably 5 to 70 mol %, more preferably 10 to 65 mol %, still more preferably 10 to 60 mol %, with respect to the total structural units (100 mol %) constituting the resin (A).

When the resin (A) is the copolymer of the acid labile monomer (a1) and the acid stable monomer, the proportion of the structural unit derived from the acid labile monomer (a1) is preferably 10 to 80 mol %, and more preferably 20 to 60 mol %, with respect to the total structural units (100 mol %) constituting the resin (A).

The proportion of the structural unit derived from the monomer having an adamantyl group (in particular, the monomer having the acid labile group (a1-1)) is preferably 15 mol % or more with respect to the structural units derived from the acid labile monomer (a1). As the mole ratio of the structural unit derived from the monomer having an adamantyl group increases within this range, the dry etching resistance of the resulting resist improves.

The resin (A) preferably is a copolymer of the acid labile monomer (a1) and the acid stable monomer. In this copolymer, the acid labile monomer (a1) is preferably at least one of the acid labile monomer (a1-1) having an adamantyl group and the acid labile monomer (a1-2) having a cyclohexyl group or a cyclopentyl group, and more preferably is the acid labile monomer (a1-1).

The acid stable monomer is preferably the acid stable monomer (a2) having a hydroxy group and/or the acid stable monomer (a3) having a lactone ring. The acid stable monomer (a2) is preferably the monomer having the hydroxyadamantyl group (a2-1).

The acid stable monomer (a3) is preferably at least one of the monomer having the γ-butyrolactone ring (a3-1) and the monomer having the condensed ring of the γ-butyrolactone ring and the norbornene ring (a3-2).

The resin (A) can be produced by a known polymerization method, for example, radical polymerization method, using at least one of the acid labile monomer (a1) and/or at least one of the acid stable monomer (a2) having a hydroxy group and/or at least one of the acid stable monomer (a3) having a lactone ring and/or at least one of a known compound.

The weight average molecular weight of the resin (A) is preferably 2,500 or more (more preferably 3,000 or more, and still more preferably 4,000 or more), and 50,000 or less (more preferably 30,000 or less, and still more preferably 15,000 or less). The weight average molecular weight is a value determined by gel permeation chromatography using polystyrene as the standard product. The detailed condition of this analysis is described in Examples.

The resist composition may contain a resin which is produced by copolymerizing the acid stable monomers and/or the known monomers in this field and does not contain the monomer (a1), in addition to the resin (A).

The resist composition of the present invention preferably contains 80 weight % or more and 99 weight % or less of the resin, with respect to the total solid proportion of the resist composition.

In the specification, the term "solid proportion of the resist composition" means the entire proportion of all ingredients other than the solvent (E). For example, if the proportion of the solvent (E) is 90 weight %, the solid proportion of the resist composition is 10 weight %.

The proportion of the resin (A) and the solid proportion of the resist composition can be measured with a known analytical method such as, for example, liquid chromatography and gas chromatography.

<Acid Generator (B)>

The acid generator has a structure to be cleaved by the action of an alkaline developer. The "structure to be cleaved by the action of an alkaline developer" means a structure which is cleaved by the action of an alkaline developer in the development step for producing a resist pattern. In other words, the structure means a basic dissociable group which converts to an alkali soluble group by decomposing through the action of alkaline. Such acid generator (B) is cleaved by contacting with an alkaline developer in the development step resulting in forming a hydrophilic group such as a hydroxy or carboxy group. Here, "cleaving" means separating into a plurality of molecules by dissociation of a bond and does not mean the ring-opening reaction.

The structure to be cleaved by the action of an alkaline developer is preferable a group represented by the formula (Ba) or a group represented by the formula (Bb);

(Ba)

wherein $R^3$ represents a $C_1$ to $C_6$ alkyl group having a fluorine atom;

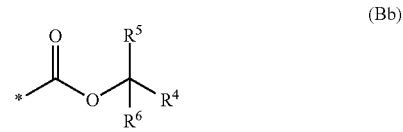

(Bb)

wherein $R^4$ represents a $C_1$ to $C_6$ alkyl group having a fluorine atom; and $R^5$ and $R^6$ independently represent a hydrogen atom or a fluorine atom.

Examples of the alkyl group having a fluorine atom of $R^3$, $R^4$, $R^5$ and $R^6$ include 1,1,1-trifluoroethyl, 2,2,2-trifluoroethyl, perfluoroethyl, 1,1,2,2-tetrafluoropropyl, 1,1,1,2,2-pentafluoropropyl, perfluorpropyl, 1,1,1,2,2,3,3-pentafluorobutyl, perfluorobutyl, 1,1,1,2,2,3,3,4,4-nonafluoropentyl, perfluoropentyl and perfluorohexyl groups.

The group represented by the formula (Ba) is cleaved to generate a hydroxy group by the action of an alkali. The group represented by the formula (Bb) is cleaved to generate a carboxyl group by the action of an alkali.

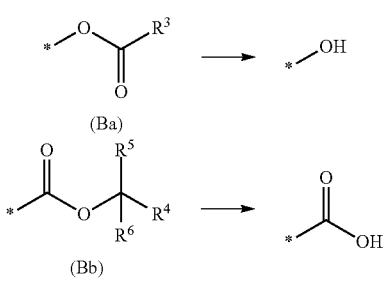

The acid generator (B) having such structure (i.e., basic dissociable group) is confirmed to be dissociated a bond by a method described below.

The acid generator having the basic dissociable group can be identified if the basic dissociable group cleaves by the action of an alkali and converts into a hydroxy group or a carboxy group, by dissolving the acid generator having the basic dissociable group in a solvent, adding an alkali developer to thus obtained solution, and mixing it. The identification of a hydroxy group or a carboxy group can be performed by the analysis of its acidity, NMR or MS. Preferred examples of the solvent include dimethylformamide and dimethylsulfoxide. Preferred examples of the alkali include tetramethylammonium hydroxide.

The acid generator (B) is preferably an acid generator represented by the formula (II-a) or an acid generator represented by the formula (II-b);

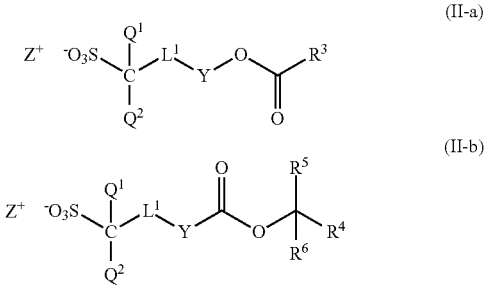

wherein $Q^1$ and $Q^2$ independently represent a fluorine atom or a $C_1$ to $C_6$ perfluoroalkyl group;

$L^1$ represents a single bond or a $C_1$ to $C_{17}$ alkanediyl group, and one or more —$CH_2$— contained in the alkanediyl group may be replaced by —O— or —CO—;

Y represents a $C_3$ to $C_{18}$ divalent alicyclic hydrocarbon group, and one or more —$CH_2$— contained in the alicyclic hydrocarbon group may be replaced by —O— or —CO—;

$R^3$ represents a $C_1$ to $C_6$ alkyl group having a fluorine atom;
$R^4$ represents a $C_1$ to $C_6$ alkyl group having a fluorine atom;
$R^5$ and $R^6$ independently represent a hydrogen atom or a fluorine atom; and $Z^+$ represents an organic cation.

Examples of the perfluoroalkyl group of $Q^1$ and $Q^2$ include trifluoromethyl, perfluoroethyl, perfluoropropyl, perfluoroisopropyl, perfluorobutyl, perfluoro-sec-butyl, perfluoro-tert-butyl, perfluoropentyl and perfluorohexyl groups.

Among these, $Q^1$ and $Q^2$ independently are preferably trifluoromethyl or fluorine atom, and more preferably a fluorine atom.

Examples of the alkanediyl group of $L^1$ include any of;

a chain alkanediyl group such as methylene, ethylene, propane-1,3-diyl, propane-1,2-diyl, butane-1,4-diyl, pentane-1,5-diyl, hexane-1,6-diyl groups;

a branched chain alkanediyl group such as 1-methylpropane-1,3-diyl, 2-methylpropane-1,3-diyl, 2-methylpropane-1,2-diyl, 1-methylbutane-1,4-diyl and 2-methylbutane-1,4-diyl groups.

Examples of the alkanediyl group of $L^1$ in which one or more —$CH_2$-contained in the alkanediyl group is replaced by —O— or —CO— include groups represented by the formula (b1-1) to the formula (b1-7) below. In the formula (b1-1) to the formula (b1-7), the group is represented so as to correspond with two sides of the formula (II-a) or the formula (II-b), that is, the left side of the group bonds to $C(Q^1)(Q^2)$- and the right side of the group bonds to —Y (examples of the formula (b1-1) to the formula (b1-7) are the same as above).
* represents a bond.

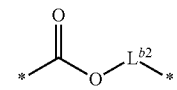

(b1-1)

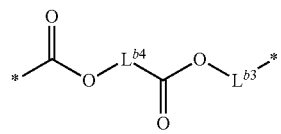

(b1-2)

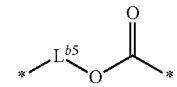

(b1-3)

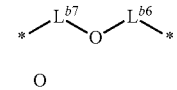

(b1-4)

(b1-5)

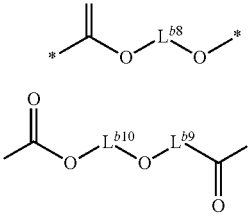

(b1-6)

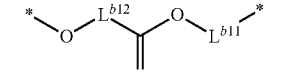

(b1-7)

wherein $L^{b2}$ represents a single bond or a $C_1$ to $C_{15}$ alkanediyl group;

$L^{b3}$ represents a single bond or a $C_1$ to $C_{12}$ alkanediyl group;

$L^{b4}$ represents a $C_1$ to $C_{13}$ alkanediyl group, the total number of the carbon atoms in $L^{b3}$ and $L^{b4}$ is at most 13;

$L^{b5}$ represents a $C_1$ to $C_{15}$ alkanediyl group;

$L^{b6}$ represents a single bond or a $C_1$ to $C_{15}$ alkanediyl group;

$L^{b7}$ represents a $C_1$ to $C_{15}$ alkanediyl group, the total number of the carbon atoms in $L^{b6}$ and $L^{b7}$ is at most 16;

$L^{b8}$ represents a $C_1$ to $C_{14}$ alkanediyl group;

$L^{b9}$ and $L^{b10}$ independently represent a $C_1$ to $C_{11}$ alkanediyl group, the total number of the carbon atoms in $L^{b9}$ and $L^{b10}$ is at most 12;

$L^{b11}$ represents a single bond or a $C_1$ to $C_{13}$ alkanediyl group;

$L^{b12}$ represents a $C_1$ to $C_{14}$ alkanediyl group, the total number of the carbon atoms in $L^{b11}$ and $L^{b12}$ is at most 14.

Among these, $L^1$ is preferably the groups represented by the formula (b1-1) to the formula (b1-4), more preferably the group represented by the formula (b1-1) to the formula (b1-3), and still more preferably the group represented by the formula (b1-1). In particular, the divalent group represented by the formula (b1-1) in which $L^{b2}$ represents a single bond or a $C_1$ to $C_6$ alkanediyl group is preferable, that is, *—CO—O—$(CH_2)_u$—, wherein u is a integer of 0 to 6, * is a bond to —$C(Q^1)(Q^2)$-, and the divalent group represented by the formula (b1-1) in which $L^{b2}$ represents a single bond or a methylene group, that is, *—CO—O— or *—CO—O—$CH_2$—, is more preferable.

Specific examples of the divalent group represented by the formula (b1-1) include groups below.

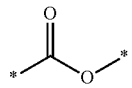 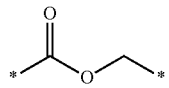

Specific examples of the divalent group represented by the formula (b1-2) include groups below.

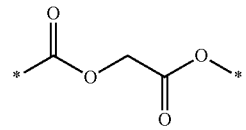 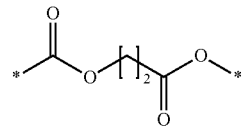

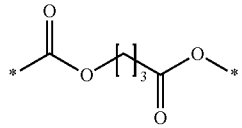 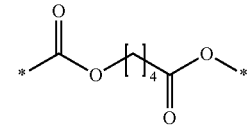

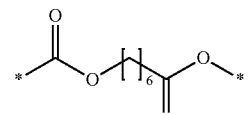 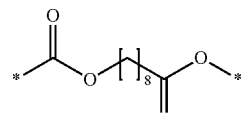

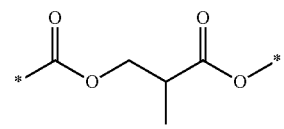 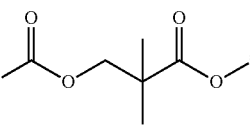

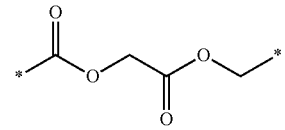 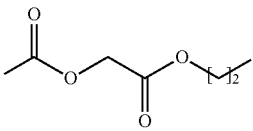

Specific examples of the divalent group represented by the formula (b1-3) include groups below.

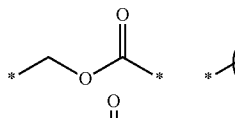 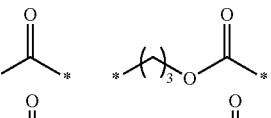

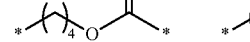 

Specific examples of the divalent group represented by the formula (b1-4) include groups below.

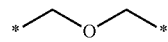

Specific examples of the divalent group represented by the formula (b1-5) include groups below.

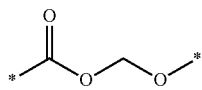 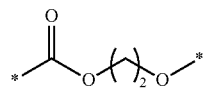

 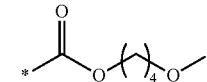

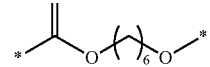

Specific examples of the divalent group represented by the formula (b1-6) include groups below.

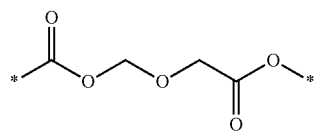

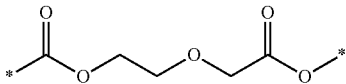

Specific examples of the divalent group represented by the formula (b1-7) include groups below.

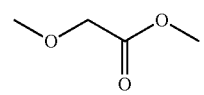 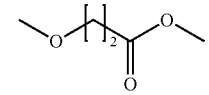

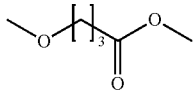 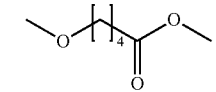

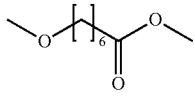 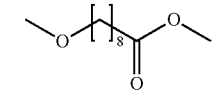

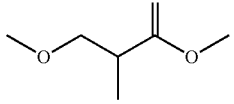 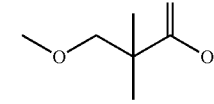

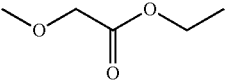 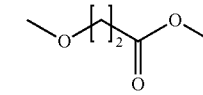

Specific examples of the divalent alicyclic group of Y include groups below.

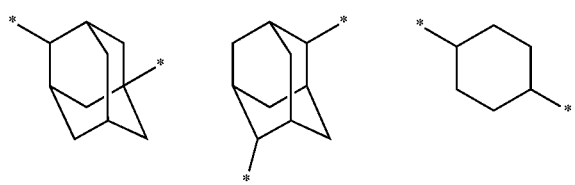

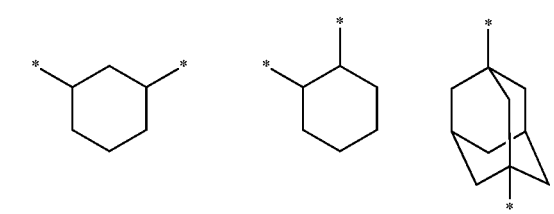

Examples of the divalent alicyclic group of Y in which one or more —CH$_2$— contained in the divalent alicyclic group is replaced by —O— or —CO— include groups below.

Y is preferably a polycyclic-alicyclic hydrocarbon group, and more preferably a polycyclic-alicyclic hydrocarbon group having an adamantan ring.

Examples of the salt represented by the formula (II-a) include salts below.

(b1-s-1)

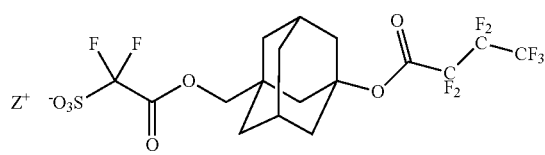

(b1-s-2)

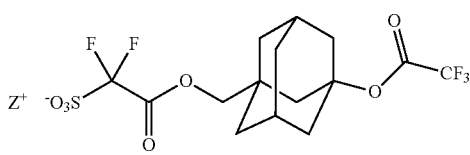

(b1-s-3)

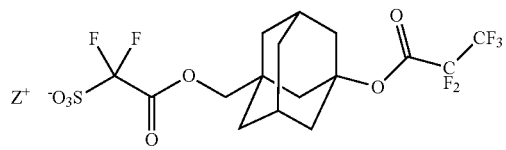

(b1-s-4)

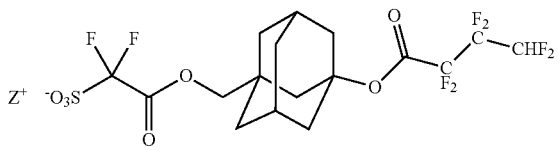

(b1-s-5)

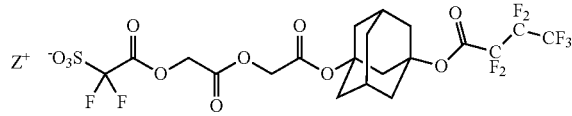

(b1-s-6)

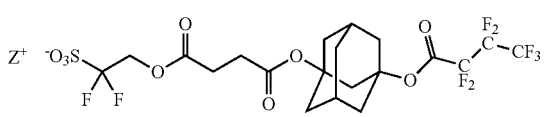

(b1-s-7)

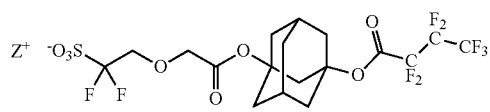

(b1-s-8)

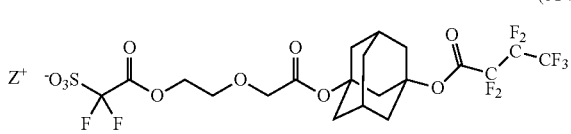

(b1-s-9)

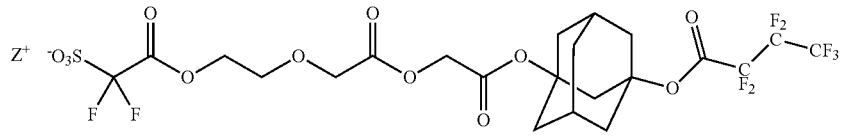

Examples of the salt represented by the formula (II-b) include salts below.

(b1-s-10)

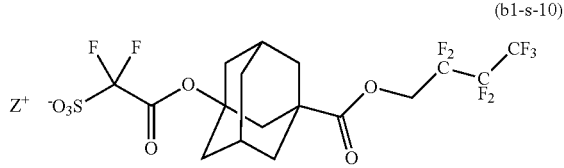

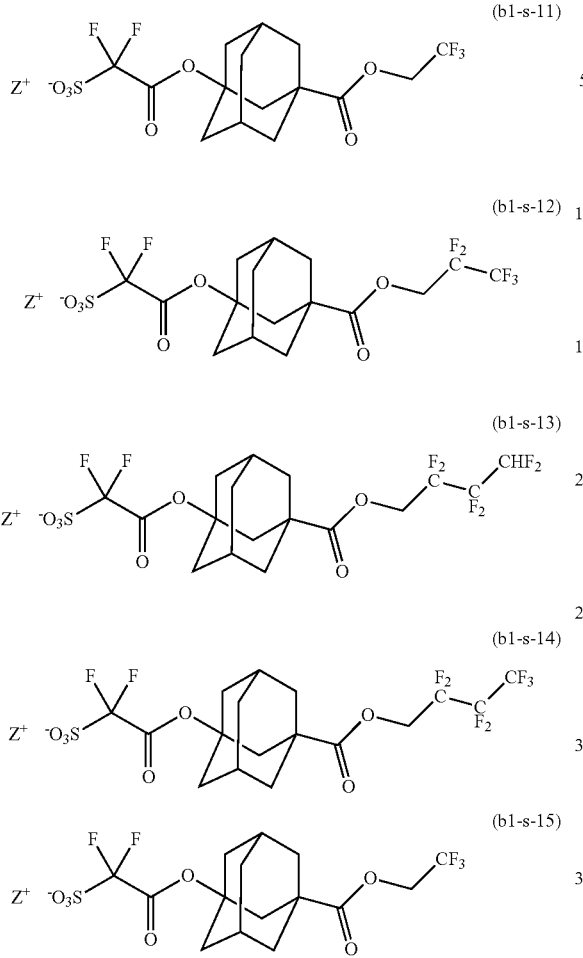

(b1-s-11)
(b1-s-12)
(b1-s-13)
(b1-s-14)
(b1-s-15)

Examples of the cation in the formula (II-a) and the formula (II-b) include an organic onium cation, for example, organic sulfonium cation, organic iodonium cation, organic ammonium cation, benzothiazolium cation and organic phosphonium cation. Among these, organic sulfonium cation and organic iodonium cation are preferable, aryl sulfonium cation and aryl iodonium cation are more preferable, and cations represented by the formula (b2-1) to (b2-4) are still more preferable.

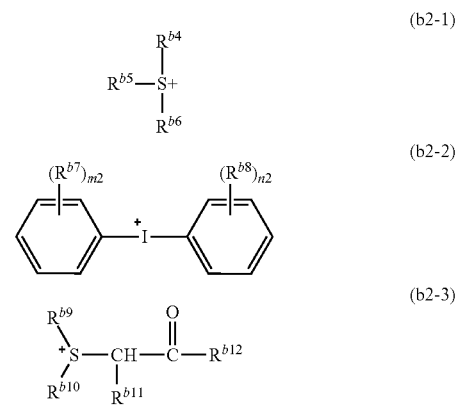

(b2-1)
(b2-2)
(b2-3)

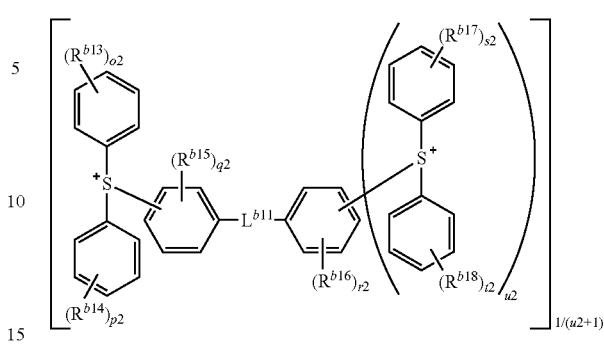

(b2-4)

wherein $R^{b4}$, $R^{b5}$ and $R^{b6}$ independently represent a $C_1$ to $C_{30}$ hydrocarbon group, the hydrocarbon group is preferably a $C_1$ to $C_{30}$ alkyl group, a $C_3$ to $C_{18}$ alicyclic hydrocarbon group or a $C_6$ to $C_{18}$ aromatic hydrocarbon group, the alkyl group may be substituted with a hydroxy group, a $C_1$ to $C_{12}$ alkoxy group or a $C_6$ to $C_{18}$ aromatic hydrocarbon group, the alicyclic hydrocarbon group may be substituted with a halogen atom, a $C_2$ to $C_4$ acyl group and a glycidyloxy group, the aromatic hydrocarbon group may be substituted with a halogen atom, a hydroxy group, a $C_1$ to $C_{18}$ alkyl group, a $C_3$ to $C_{18}$ alicyclic hydrocarbon group or a $C_1$ to $C_{12}$ alkoxy group, or $R^{b4}$ and $R^{b5}$ may be bonded together with a sulfur atom bonded thereto to form a sulfur-containing ring;

$R^{b7}$ and $R^{b8}$ in each occurrence independently represent a hydroxy group, a $C_1$ to $C_{12}$ alkyl group or a $C_1$ to $C_{12}$ alkoxyl group;

m2 and n2 independently represent an integer of 0 to 5;

$R^{b9}$ and $R^{b10}$ independently represent a $C_1$ to $C_{18}$ alkyl group or a $C_3$ to $C_{18}$ alicyclic hydrocarbon group, or $R^{b9}$ and $R^{b10}$ may be bonded together with a sulfur atom bonded thereto to form a sulfur-containing 3- to 12-membered (preferably 3- to 7-membered) ring, and one or more —$CH_2$— contained in the ring may be replaced by —O—, —S— or —CO—;

$R^{b11}$ represents a hydrogen atom, a $C_1$ to $C_{18}$ alkyl group, a $C_3$ to $C_{18}$ alicyclic hydrocarbon group or a $C_6$ to $C_{18}$ aromatic hydrocarbon group;

$R^{b12}$ represents a $C_1$ to $C_{12}$ alkyl group, a $C_3$ to $C_{18}$ alicyclic hydrocarbon group and a $C_6$ to $C_{18}$ aromatic hydrocarbon group, the aromatic hydrocarbon group may be substituted with a $C_1$ to $C_{12}$ alkyl group, a $C_1$ to $C_{12}$ alkoxy group, a $C_3$ to $C_{18}$ alicyclic hydrocarbon group or a $C_1$ to $C_{12}$ alkyl carbonyloxy group;

$R^{b11}$ and $R^{b12}$ may be bonded together with —CH—CO— bonded thereto to form a 3- to 12-membered (preferably a 3- to 7-membered) ring, and one or more —$CH_2$— contained in the ring may be replaced by —O—, —S— or —CO—;

$R^{b13}$, $R^{b14}$, $R^{b15}$, $R^{b16}$, $R^{b17}$ and $R^{b18}$ in each occurrence independently represent a hydroxy group, a $C_1$ to $C_{12}$ alkyl group or a $C_1$ to $C_{12}$ alkoxy group;

$L^{b11}$ represents —S— or —O—;

o2, p2, s2 and t2 independently represent an integer of 0 to 5;

q2 or r2 independently represent an integer of 0 to 4;

u2 represents an integer of 0 or 1.

Examples of the alkyl group preferably include methyl, ethyl, n-propyl, isopropyl, n-butyl, sec-butyl, tert-butyl, pentyl, hexyl, octyl and 2-ethylhexyl groups. Among these, the alkyl group of $R^{b9}$ to $R^{b12}$ is preferably a $C_1$ to $C_{12}$ alkyl group.

Examples of the alicyclic hydrocarbon group preferably include monocyclic groups such as cyclopentyl, cyclohexyl, methylcyclohexyl, dimethylcyclohexyl, cycloheptyl, cyclooctyl groups; and polycyclic hydrocarbon groups such as decahydronaphtyl, adamantyl, norbornyl (i.e., bicyclo [2.2.1]hexyl), and methyl norbornyl groups as well as groups below.

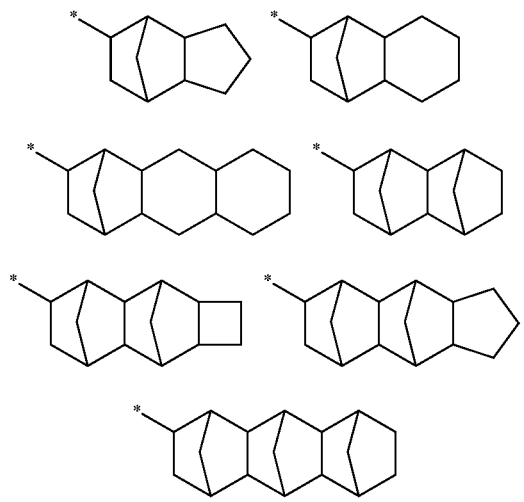

Among these, the alicyclic group of $R^{b9}$ to $R^{b11}$ is preferably a $C_3$ to $C_{18}$ alicyclic group, and more preferably a $C_4$ to $C_{12}$ alicyclic group, such as cyclopropyl, cyclobutyl, cyclopentyl, cyclohexyl, cycloheptyl, cyclodecyl, 2-alkyladamantane-2-yl, 1-(adamatane-1-yl)-1-alkyl and isobornyl groups.

Examples of the aromatic hydrocarbon group preferably include an aryl group such as phenyl, naphthyl, anthryl, p-methylphenyl, p-tert-butylphenyl, p-adamantylphenyl, tolyl, xylyl, cumenyl, mesityl, biphenyl, phenanthryl, 2,6-diethylphenyl and 2-methyl-6-ethylphenyl groups. Among these, examples thereof of $R^{b12}$ preferably include phenyl, 4-methylphenyl, 4-ethylphenyl, 4-t-butylphenyl, 4-cyclohexylphenyl, 4-methoxyphenyl, naphthyl and biphenyl groups.

Examples of the aromatic group substituted with an alkyl group typically represent an aralkyl group such as benzyl and phenethyl groups.

Examples of the halogen atom include fluorine, chlorine, bromine or iodine atom.

Examples of the alkoxyl group include methoxy, ethoxy, n-propoxy, iso-propoxy, n-butoxy, sec-butoxy, tert-butoxy, n-pentyloxy, n-hexyloxy, heptyloxy, octyloxy, 2-ethylhexyloxy, nonyloxy, decyloxy, undecyloxy and dodecyloxy groups.

Examples of the acyl group include acetyl, propionyl and butyryl groups.

Examples of the alkyl carbonyloxy group of the $R^{b12}$ include methyl carbonyloxy, ethyl carbonyloxy, n-propyl carbonyloxy, isopropyl carbonyloxy, n-butyl carbonyloxy, sec-butyl carbonyloxy, tert-butyl carbonyloxy, pentyl carbonyloxy, hexyl carbonyloxy, octylcarbonyloxy and 2-ethylhexylcarbonyloxy groups.

The sulfur atom-containing ring which is formed by $R^{b4}$ and $R^{b5}$ may be any of monocyclic, polycyclic, aromatic, non-aromatic, saturated and unsaturated rings. Also, the sulfur atom-containing ring may have at least one of sulfur atom and/or at least one of oxygen atom in addition to one sulfur atom. The sulfur atom-containing ring is preferably a ring having 3 to 18 carbon atoms, and more preferably a ring having 4 to 13 carbon atoms.

Examples of the ring having —CH—CO— and formed by $R^{b9}$ and $R^{b10}$ bonded together include thiolane-1-ium ring (tetrahydrothiophenium ring), thian-1-ium ring and 1,4-oxathian-4-ium ring.

Examples of the ring having a sulfur atom and formed by $R^{b11}$ and $R^{b12}$ bonded together include oxocycloheptane ring, oxocyclohexane ring, oxonorbornane ring and oxoadamantane ring.

Among the cations represented by the formula (b2-1) to the formula (b2-4), the cation represented by the formula (b2-1-1) is preferable, and triphenyl sulfonium cation (v2=w2=x2=0 in the formula (b2-1-1)), diphenyltolyl sulfonium cation (v2=w2=0, x2=1, and $R^{b21}$ is a methyl group in the formula (b2-1-1)) and tritolyl sulfonium cation (v2=w2=x2=1, $R^{b19}$, $R^{b20}$ and $R^{b21}$ are a methyl group in the formula (b2-1-1)) are more preferable.

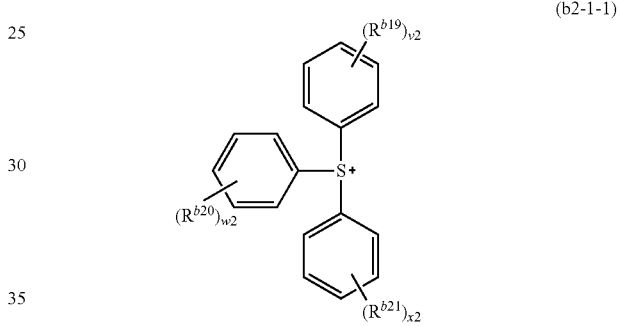

(b2-1-1)

wherein $R^{b19}$, $R^{b20}$ and $R^{b21}$ in each occurrence independently represent a halogen atom, a hydroxy group, a $C_1$ to $C_{12}$ alkyl group, a $C_3$ to $C_{18}$ alicyclic hydrocarbon group or a $C_1$ to $C_{12}$ alkoxy group, or two of $R^{b19}$, $R^{b20}$ and $R^{b21}$ may be bonded together to form a hetero atom-containing ring;

v2 to x2 independently represent an integer of 0 to 5.

In the formula (b2-1-1), $R^{b19}$ to $R^{b21}$ independently preferably represent a halogen atom (and more preferably fluorine atom), a hydroxy group, a $C_1$ to $C_{12}$ alkyl group, a $C_1$ to $C_{12}$ alkoxy group or a group containing a $C_4$ to $C_{18}$ alicyclic hydrocarbon group, and v2 to x2 independently represent preferably 0 or 1.

Specific examples of the cation of the formula (b2-1-1) include a cation below.

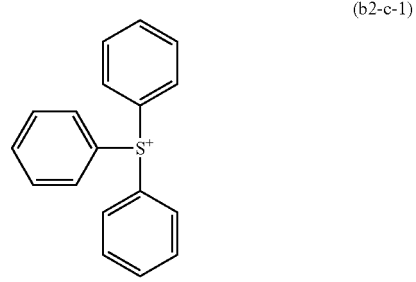

(b2-c-1)

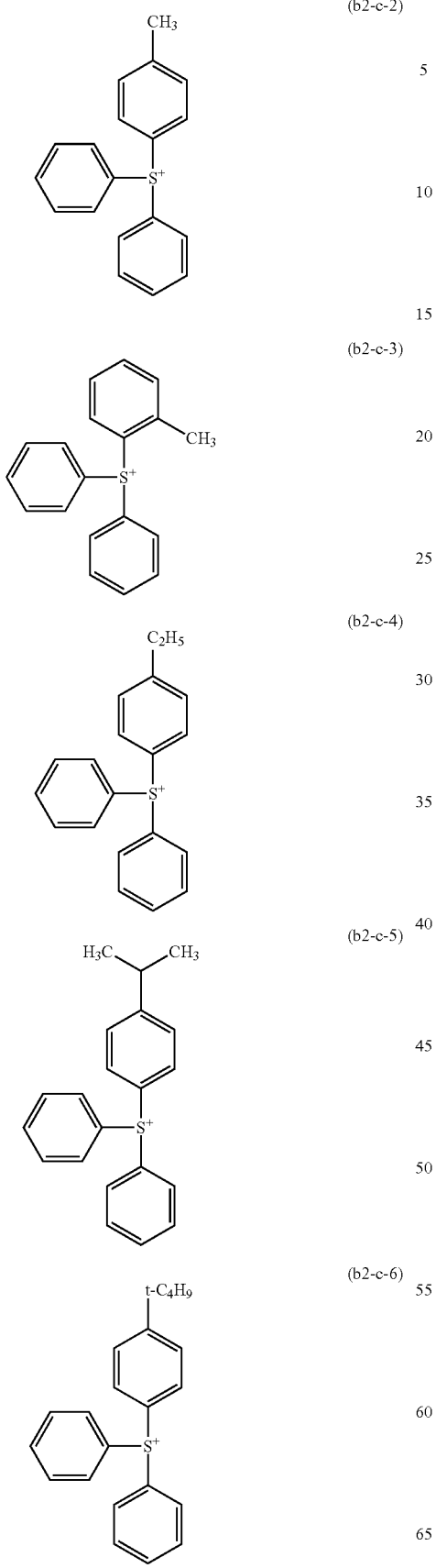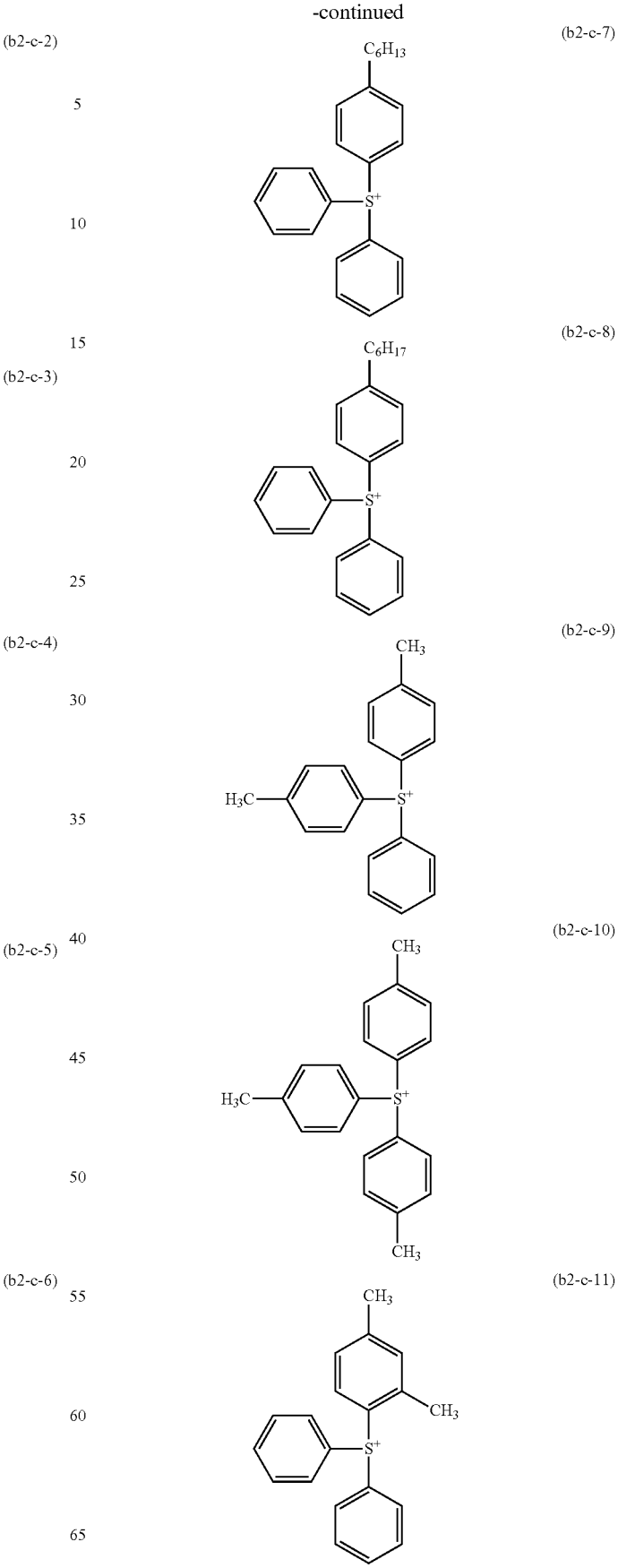

(b2-c-12), (b2-c-13), (b2-c-14), (b2-c-15), (b2-c-16), (b2-c-17), (b2-c-18), (b2-c-19), (b2-c-20), (b2-c-21), (b2-c-22)

-continued (b2-c-23)
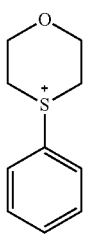

(b2-c-24)
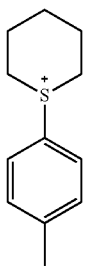

(b2-c-25)
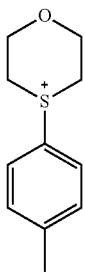

(b2-c-26)
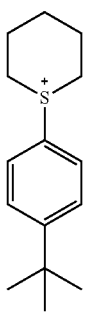

(b2-c-27)
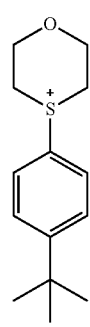

Specific examples of the cation of the formula (b2-2) include a cation below.

(b2-c-28)
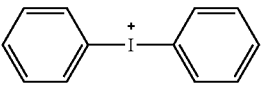

(b2-c-29)
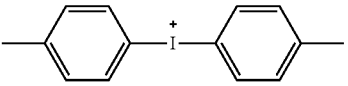

(b2-c-30)
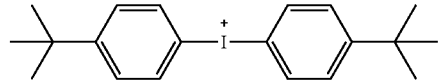

Specific examples of the cation of the formula (b2-3) include a cation below.

(b2-c-31)
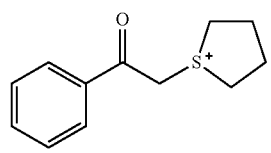

(b2-c-32)
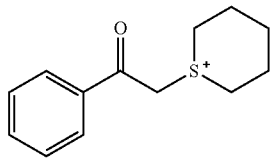

(b2-c-33)
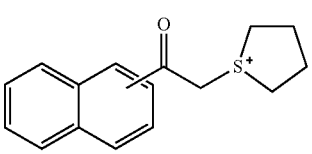

(b2-c-34)
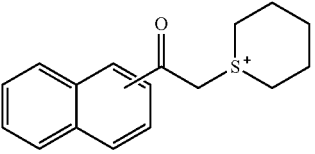

Specific examples of the organic cations may also include, for example, the cations described in JP2010-204646A.

The acid generator (B) is a compound in combination of the above sulfonate anion and an organic cation.

The above sulfonate anion and the organic cation may optionally be combined, for example, as described in the Table 1 below. The sulfonate anion represented by the formula (b1-s-2) is expressed "(b1-s-2)", and the organic cation represented by the formula (b2-c-1) is expressed "(b2-c-1)" in the table, for example.

TABLE 1

| Acid generator | Salt | $Z^+$ |
|---|---|---|
| (II-1) | (b1-s-1) | (b2-c-1) |
| (II-2) | (b1-s-1) | (b2-c-2) |
| (II-3) | (b1-s-1) | (b2-c-6) |
| (II-4) | (b1-s-1) | (b2-c-10) |
| (II-5) | (b1-s-1) | (b2-c-12) |
| (II-6) | (b1-s-1) | (b2-c-15) |
| (II-7) | (b1-s-1) | (b2-c-21) |

TABLE 1-continued

| Acid generator | Salt | Z+ |
|---|---|---|
| (II-8) | (b1-s-1) | (b2-c-23) |
| (II-9) | (b1-s-2) | (b2-c-1) |
| (II-10) | (b1-s-2) | (b2-c-2) |
| (II-11) | (b1-s-2) | (b2-c-6) |
| (II-12) | (b1-s-2) | (b2-c-10) |
| (II-13) | (b1-s-2) | (b2-c-12) |
| (II-14) | (b1-s-2) | (b2-c-15) |
| (II-15) | (b1-s-2) | (b2-c-21) |
| (II-16) | (b1-s-2) | (b2-c-23) |
| (II-17) | (b1-s-10) | (b2-c-1) |
| (II-18) | (b1-s-10) | (b2-c-2) |
| (II-19) | (b1-s-10) | (b2-c-6) |
| (II-20) | (b1-s-10) | (b2-c-10) |
| (II-21) | (b1-s-10) | (b2-c-12) |
| (II-22) | (b1-s-10) | (b2-c-15) |
| (II-23) | (b1-s-10) | (b2-c-21) |
| (II-24) | (b1-s-10) | (b2-c-23) |
| (II-25) | (b1-s-3) | (b2-c-1) |
| (II-26) | (b1-s-3) | (b2-c-10) |
| (II-27) | (b1-s-4) | (b2-c-1) |
| (II-28) | (b1-s-4) | (b2-c-10) |
| (II-29) | (b1-s-5) | (b2-c-1) |
| (II-30) | (b1-s-5) | (b2-c-10) |
| (II-31) | (b1-s-6) | (b2-c-1) |
| (II-32) | (b1-s-6) | (b2-c-10) |
| (II-33) | (b1-s-7) | (b2-c-1) |
| (II-34) | (b1-s-7) | (b2-c-10) |
| (II-35) | (b1-s-8) | (b2-c-1) |
| (II-36) | (b1-s-8) | (b2-c-10) |
| (II-37) | (b1-s-9) | (b2-c-1) |
| (II-38) | (b1-s-9) | (b2-c-10) |
| (II-39) | (b1-s-11) | (b2-c-1) |
| (II-40) | (b1-s-11) | (b2-c-10) |
| (II-41) | (b1-s-12) | (b2-c-1) |
| (II-42) | (b1-s-12) | (b2-c-10) |
| (II-43) | (b1-s-13) | (b2-c-1) |
| (II-44) | (b1-s-13) | (b2-c-10) |
| (II-45) | (b1-s-14) | (b2-c-1) |
| (II-46) | (b1-s-14) | (b2-c-10) |
| (II-47) | (b1-s-15) | (b2-c-1) |
| (II-48) | (b1-s-15) | (b2-c-10) |

More preferable examples of the acid generator (B) include salts below.

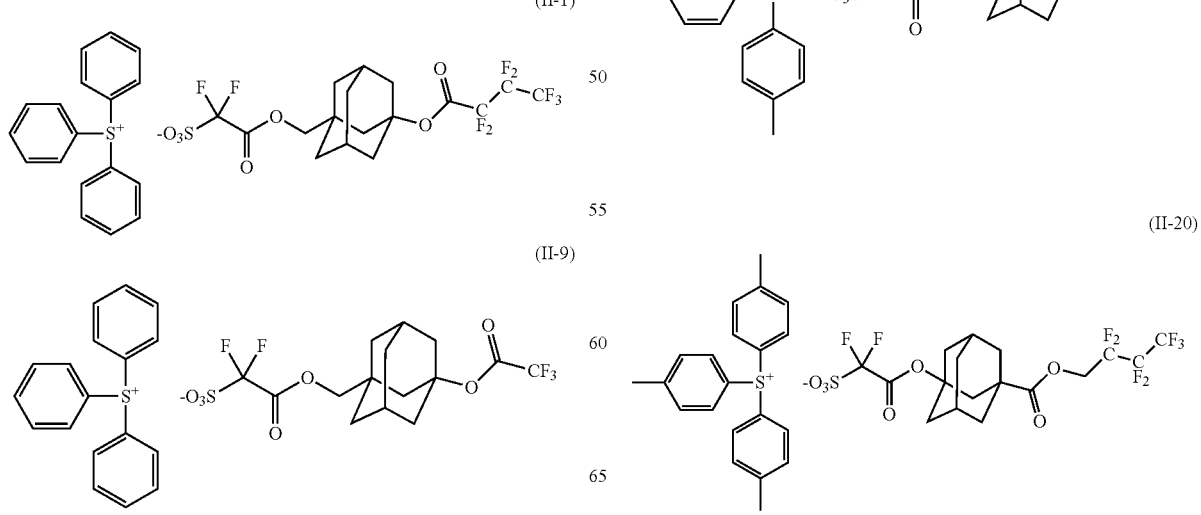

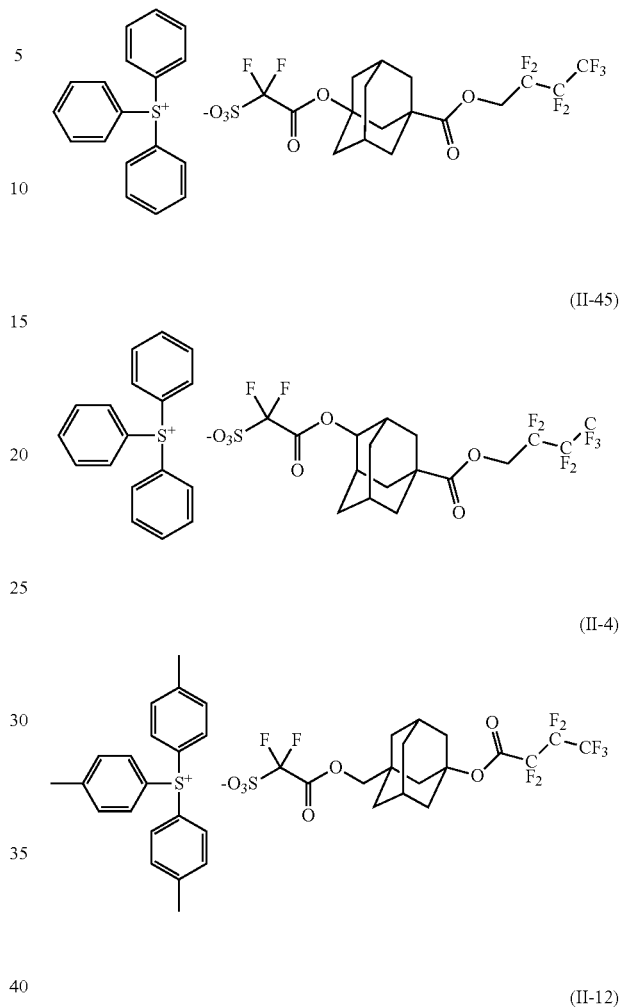

-continued (II-46)

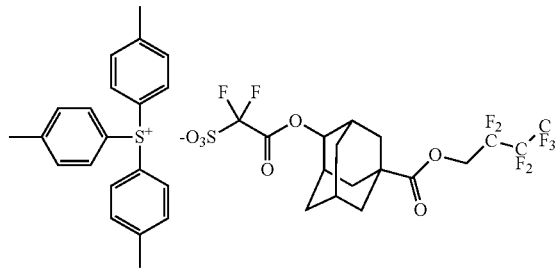

The acid generator (B) can be produced by methods described as or according to a method below. In the formulae below, the groups have the same definition of the above.

A salt represented by the formula (II-a) can be produced by reacting a compound represented by the formula (II-a-a) with a compound represented by the formula (II-a-b) in presence of a basic catalyst in a solvent.

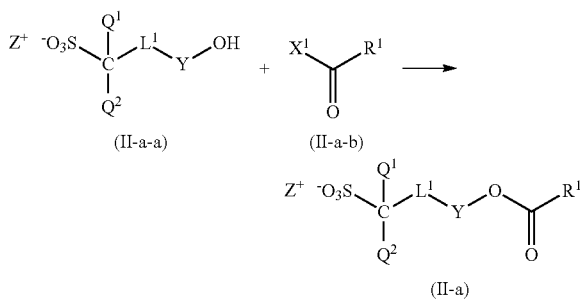

wherein $X^1$ represents a halogen atom or —O—CO—$R^1$—.

Preferred examples of the solvent include chloroform. Preferred examples of the basic catalyst include N-methylpyrrolidine.

The compound represented by the formula (II-a-a) can be produced by a method described in JP2006-257078A.

Examples of the compound represented by the formula (II-a-b) include heptafluorobutyl chloride.

The acid generator (B) represented by the formula (II-a) or an acid generator represented (B) by the formula (II-b) may be used as a single salt or as a combination of two or more salts, respectively and a combination of the acid generator (B) represented by the formula (II-a) and an acid generator (B) represented by the formula (II-b).

The resist composition of the present invention may include one or more known acid generator for the acid generator other than the acid generator (B).

An acid generator is classified into non-ionic-based or ionic-based acid generator.

Examples of the non-ionic-based acid generator include organic halogenated compounds; sulfonate esters such as 2-nitrobenzyl ester, aromatic sulfonate, oxime sulfonate, N-sulfonyl oxyimide, sulfonyl oxyketone and diazo naphthoquinone 4-sulfonate; sulfones such as disulfone, ketosulfone and sulfone diazomethane.

Examples of the ionic acid generator includes onium salts containing onium cation (such as diazonium salts, phosphonium salts, sulfonium salts, iodonium salts).

Examples of anion of onium salts include sulfonate anion, sulfonylimide anion and sulfonylmethyde anion.

For the acid generator (B), compounds which generate an acid by radiation described in JP S63-26653-A, JP S55-164824-A, JP S62-69263-A, JP S63-146038-A, JP S63-163452-A, JP S62-153853-A, JP S63-146029-A, U.S. Pat. No. 3,779,778-B, U.S. Pat. No. 3,849,137-B, DE3,914,407-B and EP-126,712-A can be used. Also, the acid generator formed according to conventional methods can be used.

A fluorine-containing acid generator is preferable for the acid generator (B), and a sulfonic acid salt represented by the formula (B1) is more preferable.

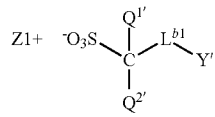

(B1)

wherein $Q^{1'}$ and $Q^{2'}$ independently represent a fluorine atom or a $C_1$ to $C_6$ perfluoroalkyl group;

$L^{b1}$ represents a single bond or an $C_1$ to $C_{17}$ divalent saturated hydrocarbon group, and one or more —$CH_2$— contained in the divalent saturated hydrocarbon group may be replaced by —O— or —CO—;

Y' represents an optionally substituted $C_1$ to $C_{18}$ alkyl group or an optionally substituted $C_3$ to $C_{18}$ alicyclic hydrocarbon group, and one or more —$CH_2$— contained in the alkyl group and alicyclic hydrocarbon group may be replaced by —O—, —CO— or —$SO_2$—, provided that Y' does not represent a group which has a structure to be cleaved by the action of an alkaline developer; and $Z1^+$ represents an organic cation.

Examples of the perfluoroalkyl group include trifluoromethyl, perfluoroethyl, perfluoropropyl, perfluoro-isopropyl, perfluorobutyl, perfluoro-sec-butyl, perfluoro-tert-butyl, perfluoropentyl and perfluorohexyl groups.

Among these, $Q^{1'}$ and $Q^{2'}$ independently are preferably trifluoromethyl or fluorine atom, and more preferably a fluorine atom.

Examples of the a divalent saturated hydrocarbon group of $L^{b1}$ include any of;

a chain alkanediyl group such as methylene, ethylene, propane-1,3-diyl, propane-1,2-diyl, butane-1,4-diyl, pentane-1,5-diyl, hexane-1,6-diyl, heptane-1,7-diyl, octane-1,8-diyl, nonane-1,9-diyl, decane-1,10-diyl, undecane-1,11-diyl, dodecane-1,12-diyl, tridecane-1,13-diyl, tetradecane-1,14-diyl, pentadecane-1,15-diyl, hexadecane-1,16-diyl, heptadecane-1,17-diyl groups, methane-1,1-diyl, ethane-1,1-diyl, propan-1,1-diyl and propan-2,2-diyl groups;

a branched chain alkanediyl group such as a group in which a chain alkanediyl group is bonded a side chain of a $C_1$ to $C_4$ alkyl group such as methyl, ethyl, propyl, isopropyl, butyl, sec-butyl and tert-butyl, for example, butan-1,3-diyl, 2-methylpropane-1,3-diyl, 2-methylpropane-1,2-diyl, pentane-1,4-diyl, 2-methylbutane-1,4-diyl groups;

a mono-alicyclic saturated hydrocarbon group such as a cycloalkanediyl group (e.g., cyclobutan-1,3-diyl, cyclopentan-1,3-diyl, cyclohexane-1,2-diyl, 1-methylhexane-1,2-diyl, cyclohexane-1,4-diyl, cyclooctan-1,2-diyl, cyclooctan-1,5-diyl groups);

a poly-alicyclic saturated hydrocarbon group such as norbornane-1,4-diyl, norbornane-2,5-diyl, adamantane-1,5-diyl and adamantane-2,6-diyl groups; and a combination of two or more groups.

Examples of the saturated hydrocarbon group of $L^{b1}$ in which one or more —$CH_2$— contained in the saturated hydrocarbon group is replaced by —O— or —CO— include groups represented by the formula (b1-1') to the formula (b1-7') below. In the formula (b1-1') to the formula (b1-7'), the group is represented so as to correspond with two sides of the formula (B1), that is, the left side of the group bonds to $C(Q^1)(Q^2)$- and the right side of the group bonds to —Y' (examples of the formula (b1-1') to the formula (b1-7') are the same as above). * represents a bond.

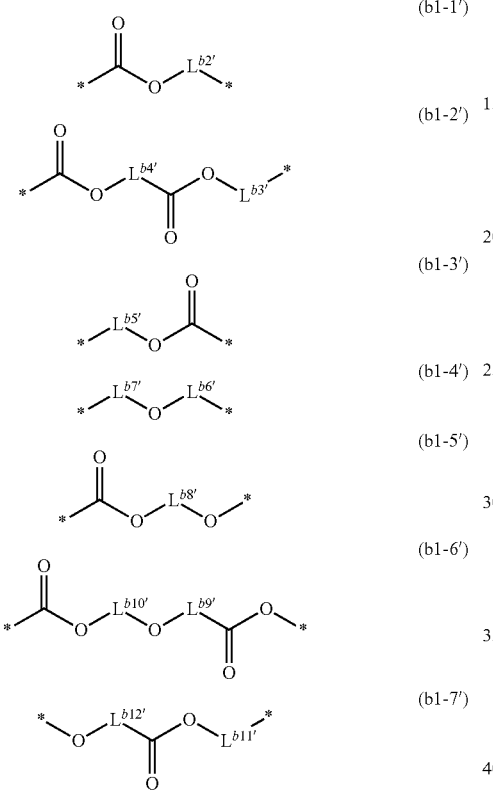

wherein $L^{b2'}$ represents a single bond or a $C_1$ to $C_{15}$ divalent saturated hydrocarbon group;

$L^{b3'}$ represents a single bond or a $C_1$ to $C_{12}$ divalent saturated hydrocarbon group;

$L^{b4'}$ represents a $C_1$ to $C_{13}$ divalent saturated hydrocarbon group, the total number of the carbon atoms in $L^{b3}$ and $L^{b4}$ is at most 13;

$L^{b5'}$ represents a $C_1$ to $C_{15}$ divalent saturated hydrocarbon group;

$L^{b6'}$ and $L^{b7'}$ independently represent a $C_1$ to $C_{15}$ divalent saturated hydrocarbon group, the total number of the carbon atoms in $L^{b6'}$ and $L^{b7'}$ is at most 16;

$L^{b8'}$ represents a $C_1$ to $C_{14}$ divalent saturated hydrocarbon group;

$L^{b9'}$ and $L^{b10'}$ independently represent a $C_1$ to $C_{11}$ divalent saturated hydrocarbon group, the total number of the carbon atoms in $L^{b9'}$ and $L^{b10'}$ is at most 12;

$L^{b11'}$ represents a single bond or a $C_1$ to $C_{13}$ divalent saturated hydrocarbon group;

$L^{b12'}$ represents a $C_1$ to $C_{14}$ divalent saturated hydrocarbon group, the total number of the carbon atoms in $L^{b11'}$ and $L^{b12'}$ is at most 14.

Among these, $L^{b1}$ is preferably the groups represented by the formula (b1-1') to the formula (b1-4'), more preferably the group represented by the formula (b1-1') or the formula (b1-2'), and still more preferably the group represented by the formula (b1-1'). In particular, the divalent group represented by the formula (b1-1') in which $L^{b2'}$ represents a single bond or —CH$_2$— is preferable.

Specific examples of the divalent groups represented by the formula (b1-1') to the formula (b1-5') and the formula (b1-7') include the same groups represented by the formula (b1-1) to the formula (b1-5) and the formula (b1-7).

Specific examples of the divalent group represented by the formula (b1-6') include groups below, in addition to the examples of groups represented by the formula (b1-6).

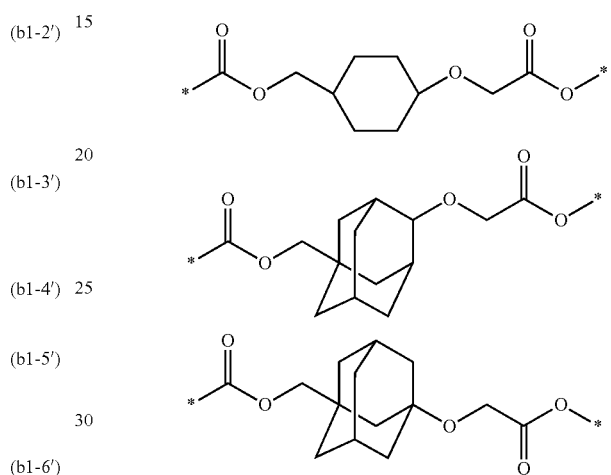

Examples of the alkyl group of Y' include methyl, ethyl, 1-methylethyl, 1,1-dimethylethyl, 2,2-dimethylethyl, propyl, 1-methylpropyl, 2,2-dimethylpropyl, 1-ethylpropyl, butyl, 1-methylbutyl, 2-methylbutyl, 3-methylbutyl, 1-propylbutyl, pentyl, 1-methylpentyl, hexyl, 1,4-dimethylhexyl, heptyl, 1-methylheptyl, octyl, methyloctyl, methylnonyl, 2-ethylhexyl, nonyl, decyl, undecyl and dodecyl groups.

The alkyl group of Y is preferably a $C_1$ to $C_6$ alkyl group.

Examples of the alicyclic hydrocarbon group of Y' include groups represented by the formula (Y1) to the formula (Y11).

Examples of the alicyclic hydrocarbon group of Y' in which one or more —CH$_2$— contained in the alicyclic hydrocarbon group replaced by —O—, —CO— or —SO$_2$— include groups represented by the formula (Y12) to the formula (Y26).

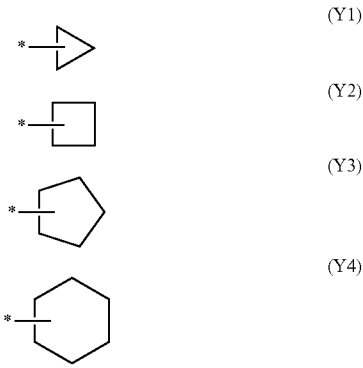

(Y5) 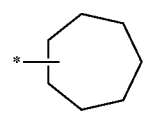
(Y6) 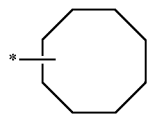
(Y7) 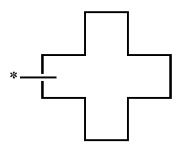
(Y8) 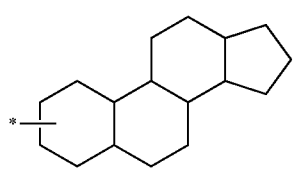
(Y9) 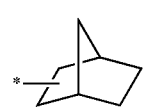
(Y10) 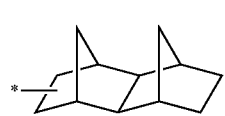
(Y11) 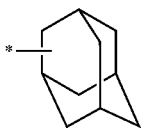
(Y12) 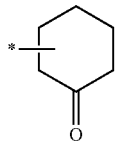
(Y13) 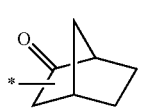
(Y14) 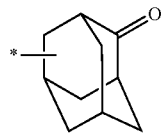
(Y15) 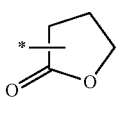
(Y16) 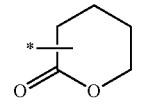
(Y17) 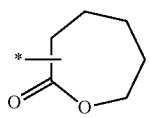
(Y18) 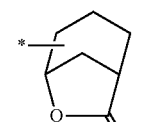
(Y19) 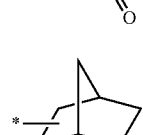
(Y20) 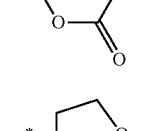
(Y21) 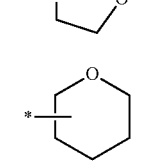
(Y22) 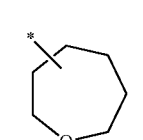
(Y23) 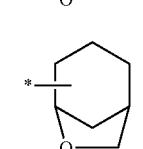
(Y24) 
(Y25) 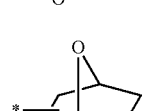
(Y26) 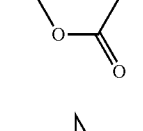
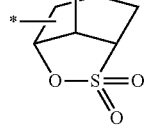
Among these, the alicyclic hydrocarbon group is preferably any one of groups represented by the formula (Y1) to the formula (Y19), more preferably any one of groups represented by the formula (Y11), (Y14), (Y15) or (Y19), and still more preferably group represented by the formula (Y11) or (Y14).

Y' may have a substituent.

Examples of the substituent of Y' include a halogen atom, a hydroxy group, an oxo group, a $C_1$ to $C_{12}$ alkyl group, a hydroxy group-containing $C_1$ to $C_{12}$ alkyl group, a $C_3$ to $C_{16}$ alicyclic hydrocarbon group, a $C_1$ to $C_{12}$ alkoxy group, a $C_6$ to $C_{18}$ aromatic hydrocarbon group, a $C_7$ to $C_{21}$ aralkyl group, a $C_2$ to $C_4$ acyl group, a glycidyloxy group or a —$(CH_2)_{j2}$—O—CO—$R^{b1}$ group, wherein $R^{b1}$ represents a $C_1$ to $C_{16}$ alkyl group, a $C_3$ to $C_{16}$ alicyclic hydrocarbon group or a $C_6$ to $C_{18}$ aromatic hydrocarbon group, j2 represents an integer of 0 to 4. The alkyl group, alicyclic hydrocarbon group, aromatic hydrocarbon group and the aralkyl group of the substituent may further have a substituent such as a $C_1$ to $C_6$ alkyl group, a halogen atom, a hydroxy group and an oxo group.

Examples of the halogen atom, the aromatic hydrocarbon group, the alkoxy group, the acyl group include the same examples described above.

Examples of the hydroxy group-containing alkyl group include hydroxymethyl and hydroxyethyl groups.

Examples of the aralkyl group include benzyl, phenethyl, phenylpropyl, naphthylmethyl and naphthylethyl groups.

Examples of Y' include the groups below.

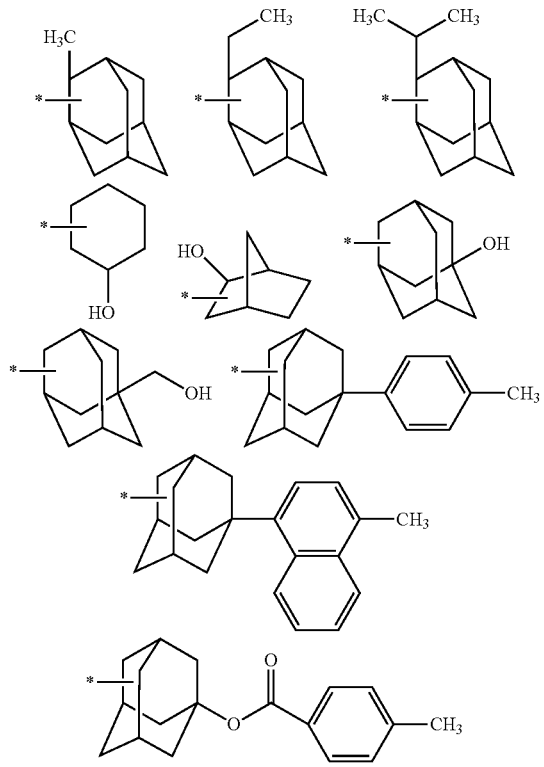

When Y' represents an alkyl group and $L^{b1}$ represents a $C_1$ to $C_{17}$ divalent alicyclic hydrocarbon group, the —$CH_2$— contained in the divalent alicyclic hydrocarbon group bonding Y' is preferably replaced by an oxygen atom or carbonyl group. In this case, the —$CH_2$— contained in the alkyl group constituting Y' is not replaced by an oxygen atom or carbonyl group.

Y' is preferably an optionally substituted $C_3$ to $C_{18}$ alicyclic hydrocarbon group, more preferably an adamantyl group which is optionally substituted, for example, an oxo group and a hydroxy group, and still more preferably an adamantyl group, a hydroxyadamantyl group and an oxoadamantyl group.

The sulfonate anion is preferably an anions represented by the formula (b1-1-1) to the formula (b1-1-9) below. In the formula (b1-1-1) to the formula (b1-1-9), $Q^{1'}$, $Q^{2'}$ and $L^{b2}$ represents the same meaning as defined above. $R^{b2}$ and $R^{b3}$ independently represent a $C_1$ to $C_4$ alkyl group (preferably methyl group).

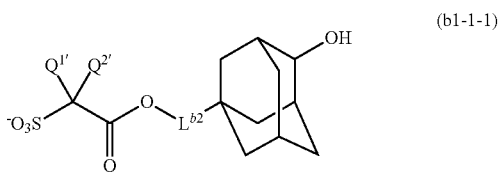
(b1-1-1)

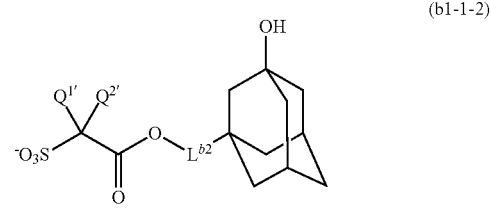
(b1-1-2)

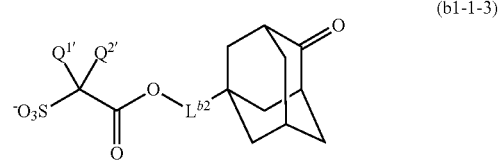
(b1-1-3)

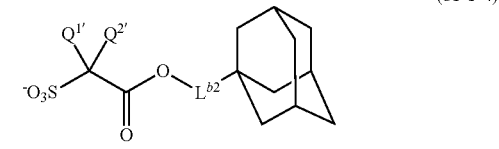
(b1-1-4)

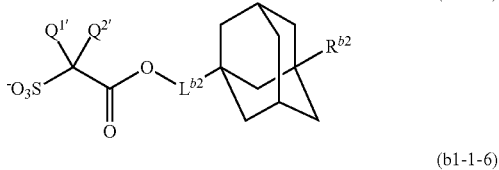
(b1-1-5)

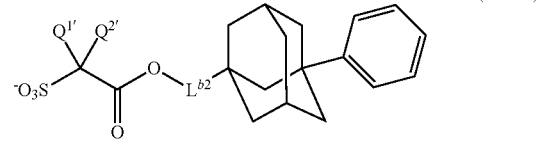
(b1-1-6)

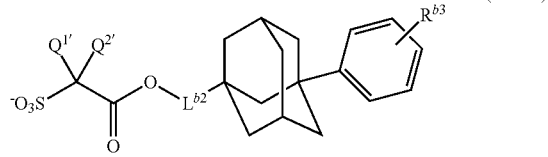
(b1-1-7)

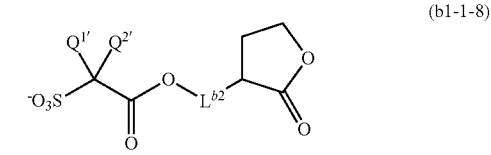
(b1-1-8)

(b1-1-9)

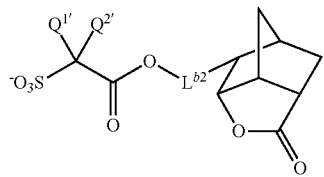

Specific examples of the sulfonate anion include sulfonate anions described in JP2010-204646A.

The cation of the acid generator (B1) include the same cations as in the acid generator represented by the formula (II-a) or the formula (II-b).

The acid generator (B1) is a salt combined the above sulfonate anion with an organic cation.

The above sulfonate anion and the organic cation may optionally be combined, a combination of any of the anion represented by the formula (b1-1-1) to the formula (b1-1-9) and the cation represented by the formula (b2-1-1), as well as a combination of any of the anion represented by the formula (b1-1-3) to the formula (b1-1-5) and the cation represented by the formula (b2-3) are preferable.

Preferred acid generators (B1) are represented by the formula (B1-1) to the formula (B1-20). Among these, the formulae (B1-1), (B1-2), (B1-6), (B1-11), (B1-12), (B1-13) and (B1-14) which contain triphenyl sulfonium cation, and the formulae (B1-3) and (B1-7) which contain tritolyl sulfonium cation are preferable.

(B1-1)

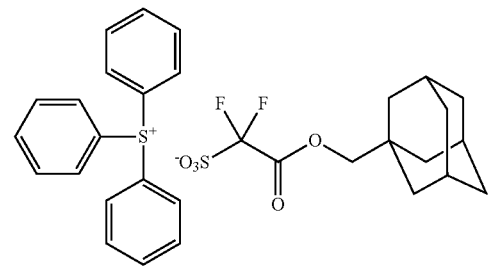

(B1-2)

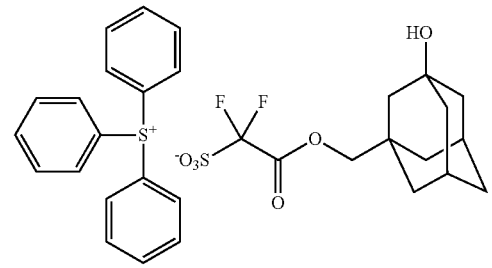

(B1-3)

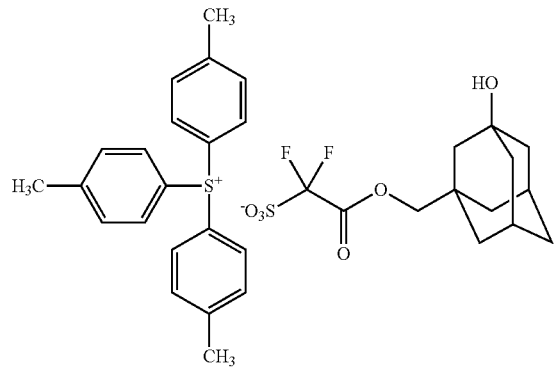

(B1-4)

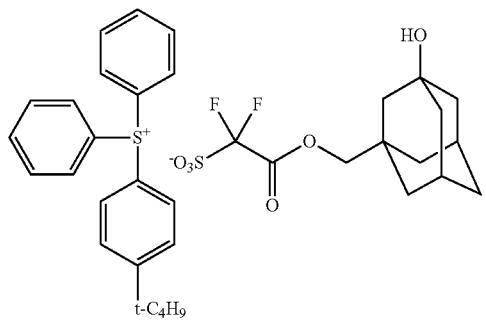

(B1-5)

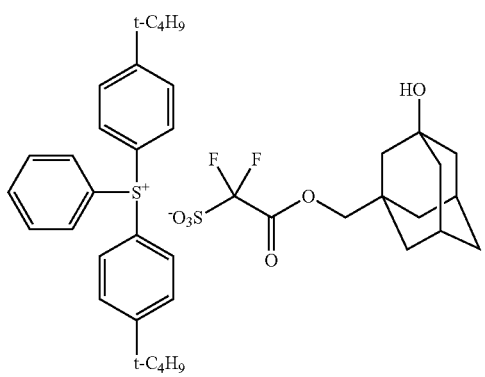

(B1-6)

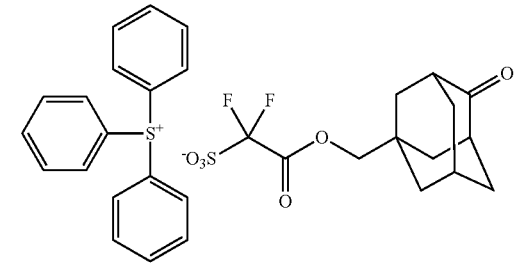

(B1-7)

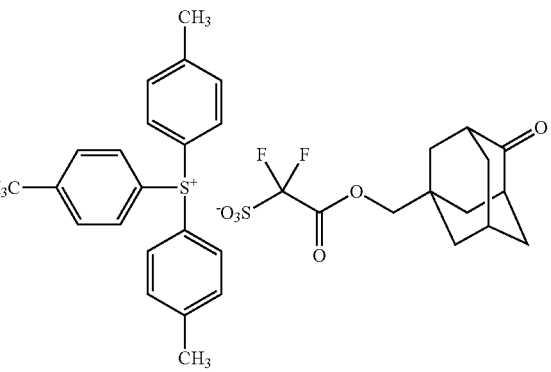

(B1-8)
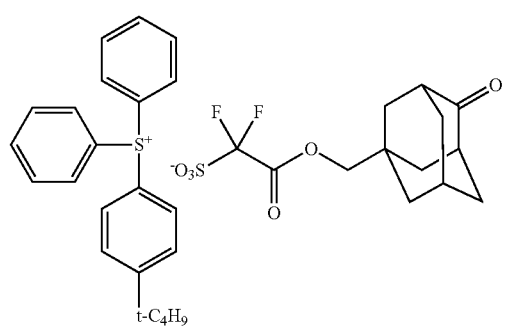
(B1-9)
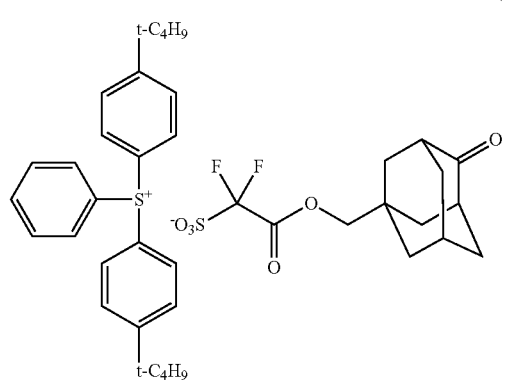
(B1-10)
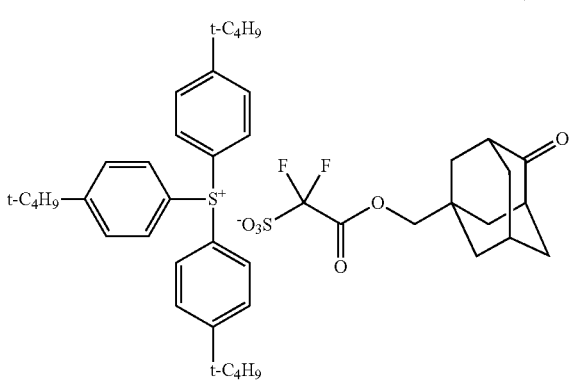
(B1-11)
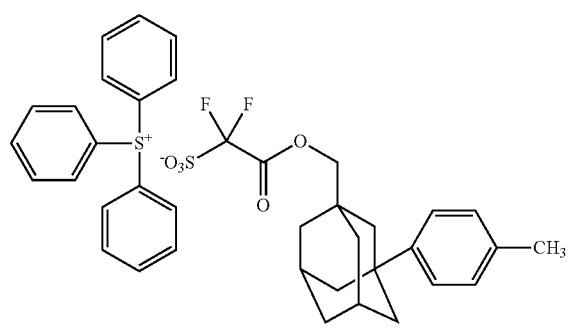
(B1-12)
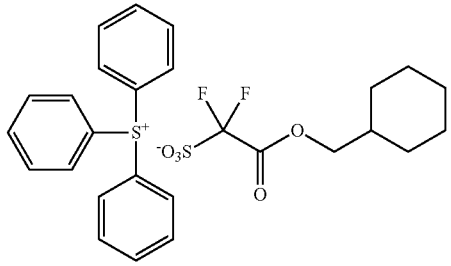
(B1-13)
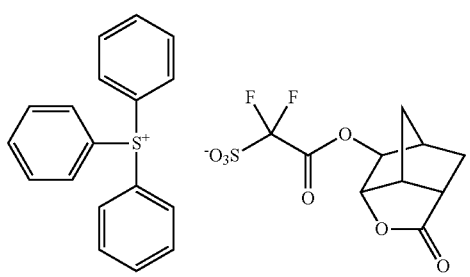
(B1-14)
(B1-15)
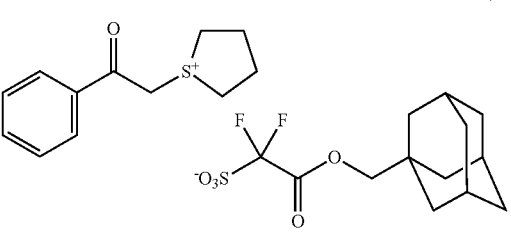
(B1-16)
(B1-17)
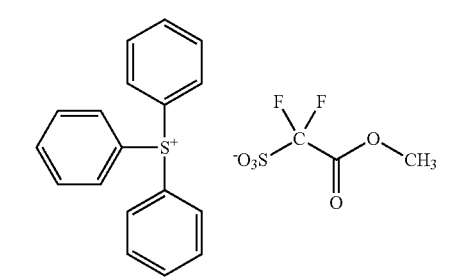

(B1-18)

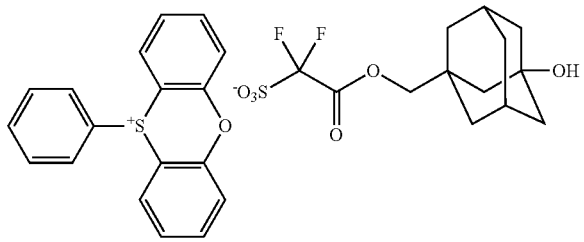

(B1-19)

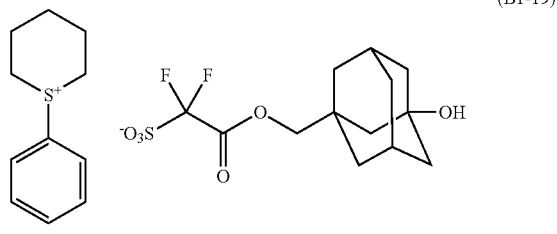

(B1-20)

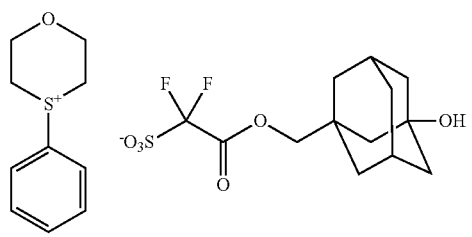

In the resist composition of the present invention, the proportion of the acid generator (B) is preferably not less than 1 parts by weight (and more preferably not less than 3 parts by weight), and not more than 40 parts by weight (and more preferably not more than 35 parts by weight), with respect to 100 parts by weight of the resin (A).

When the resist composition of the present invention also contains the acid generator such as the acid generator (B1), the total proportion thereof is preferably not less than 1 parts by weight (and more preferably not less than 3 parts by weight), and not more than 40 parts by weight (and more preferably not more than 35 parts by weight), with respect to 100 parts by weight of the resin (A).

In this case, the weight ratio of the acid generator (B) and the acid generator other than the acid generator (B), such as the acid generator (B1), may be 5/95 to 95/5, preferably 10/90 to 90/10, and more preferably 15/85 to 85/15.

<Compound (I)>

The compound (I) is the compound represented by the formula (I) below.

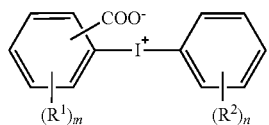

(I)

wherein $R^1$ and $R^2$ in each occurrence independently represent a $C_1$ to $C_{12}$ hydrocarbon group, a $C_1$ to $C_6$ alkoxyl group, a $C_2$ to $C_7$ acyl group, a $C_2$ to $C_7$ acyloxy group, a $C_2$ to $C_7$ alkoxycarbonyl group, a nitro group or a halogen atom;

m and n independently represent an integer of 0 to 4.

The hydrocarbon group of $R^1$ and $R^2$ includes any of an aliphatic hydrocarbon group, an alicyclic hydrocarbon group, an aromatic hydrocarbon group and a combination thereof.

Examples of the aliphatic hydrocarbon group include an alkyl group such as methyl, ethyl, propyl, isopropyl, butyl, sec-butyl, tert-butyl, pentyl, hexyl and nonyl groups.

The alicyclic hydrocarbon group is any one of monocyclic or polycyclic hydrocarbon group, and saturated or unsaturated hydrocarbon group. Examples thereof include a cycloalkyl group such as cyclopropyl, cyclobutyl, cyclopentyl, cyclohexyl, cyclononyl and cyclododecyl groups; adamantyl and norbornyl groups. The alicyclic hydrocarbon group is preferably saturated hydrocarbon group.

Examples of the aromatic hydrocarbon group include an aryl group such as phenyl, 1-naphthyl, 2-naphthyl, 2-methylphenyl, 3-methylphenyl, 4-methylphenyl, 4-ethylphenyl, 4-propylphenyl, 4-isopropylphenyl, 4-butylphenyl, 4-tert-butylphenyl, 4-hexylphenyl, 4-cyclohexylphenyl, anthryl, p-adamantylphenyl, tolyl, xylyl, cumenyl, mesityl, biphenyl, phenanthryl, 2,6-diethylphenyl and 2-methyl-6-ethylphenyl groups.

Examples of the combination thereof include an alkyl-cycloalkyl, a cycloalkyl-alkyl, aralkyl (e.g., phenylmethyl, 1-phenylethyl, 2-phenylethyl, 1-phenyl-1-propyl, 1-phenyl-2-propyl, 2-phenyl-2-propyl, 3-phenyl-1-propyl, 4-phenyl-1-butyl, 5-phenyl-1-pentyl and 6-phenyl-1-hexyl groups) groups.

Examples of the alkoxyl group include methoxy and ethoxy groups.

Examples of the acyl group include acetyl, propanonyl, benzoyl and cyclohexanecarbonyl groups.

Examples of the acyloxy group include a group in which oxy group (—O—) bonds to an acyl group.

Examples of the alkoxycarbonyl group include a group in which the carbonyl group (—CO—) bonds to the alkoxy group, such as methoxycarbonyl, ethoxycarbonyl, n-propoxycarbonyl, isopropoxycarbonyl, n-butoxycarbonyl, sec-butoxycarbonyl, and tert-butoxycarbonyl groups.

Example of the halogen atom is a chlorine atom, a fluorine atom and bromine atom.

In the formula (I), $R^1$ and $R^2$ in each occurrence independently preferably represent a $C_1$ to $C_6$ hydrocarbon group, a $C_1$ to $C_4$ alkoxyl group, a $C_2$ to $C_5$ acyl group, a $C_2$ to $C_5$ acyloxy group, a $C_2$ to $C_5$ alkoxycarbonyl group, a nitro group or a halogen atom.

m and n independently preferably represent an integer of 0 to 3, more preferably an integer of 0 to 2, and still more preferably 0.

Specific examples of the compound (I) include compounds below.

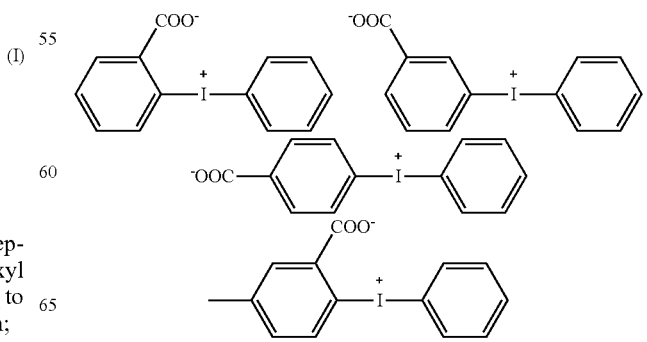

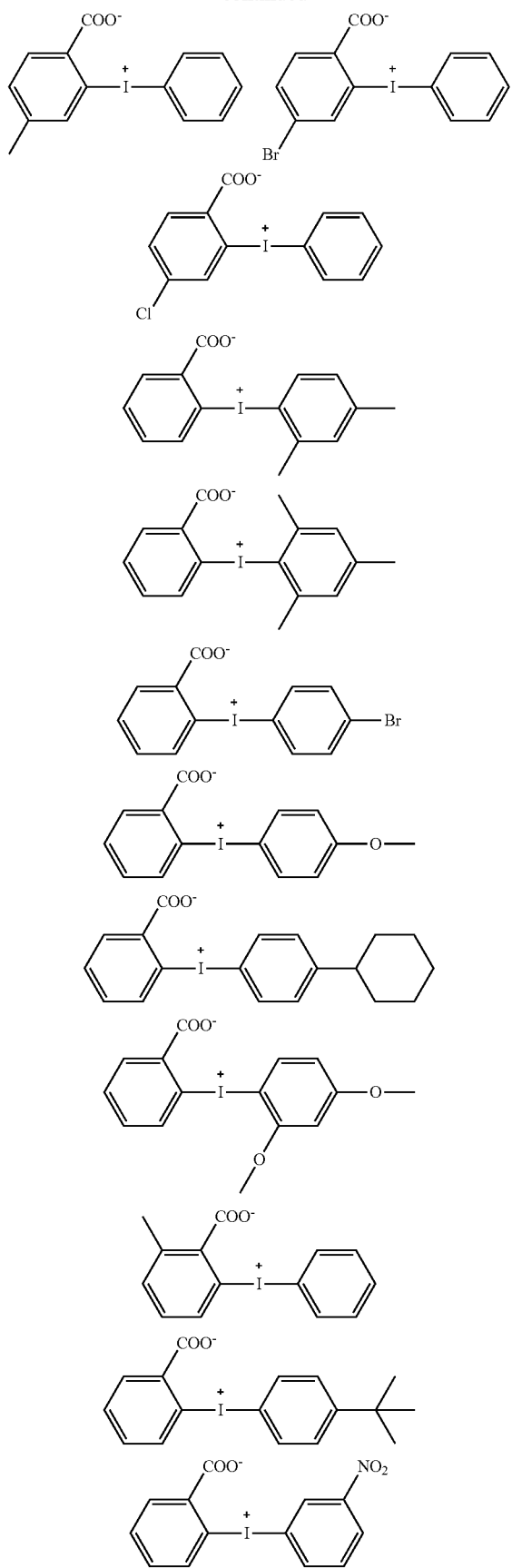

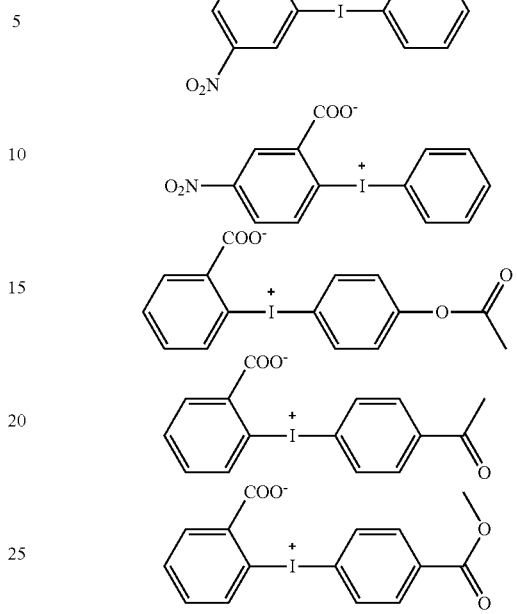

The compound (I) can be produced by a method described in "Tetrahedron Vol. 45, No. 19, p6281-6296". Also, commercially available compounds can be used as the compound (I).

In the resist composition of the present invention, the proportion of the compound (I) is preferably 0.01 to 5 weight %, and more preferably 0.01 to 3 weight %, and still more preferably 0.01 to 1 weight % with respect to total solid proportion of the resist composition.

<Solvent (E)>

The resist composition of the present invention preferably includes a solvent (E). The proportion of the solvent (E) is 90 weight % or more, preferably 92 weight % or more, and more preferably 94 weight % or more, and also preferably 99 weight % or less and more preferably 99.9 weight % or less. The proportion of the solvent (E) can be measured with a known analytical method such as, for example, liquid chromatography and gas chromatography.

Examples of the solvent (E) include glycol ether esters such as ethylcellosolve acetate, methylcellosolve acetate and propylene glycol monomethyl ether acetate; glycol ethers such as propylene glycol monomethyl ether; ethers such as diethylene glycol dimethyl ether; esters such as ethyl lactate, butyl acetate, amyl acetate and ethyl pyruvate; ketones such as acetone, methyl isobutyl ketone, 2-heptanone and cyclohexanone; and cyclic esters such as γ-butyrolactone. These solvents may be used as a single solvent or as a mixture of two or more solvents.

<Basic Compound (C)>

The resist composition of the present invention may contain a basic compound (C). The basic compound (C) is a compound having a property to quench an acid, in particular, generated from the acid generator (B), and called "quencher".

As the basic compounds (C), nitrogen-containing basic compounds (for example, amine and basic ammonium salt) are preferable. The amine may be an aliphatic amine or an aromatic amine. The aliphatic amine includes any of a primary amine, secondary amine and tertiary amine. The aromatic amine includes an amine in which an amino group is bonded to an aromatic ring such as aniline, and a heteroaromatic amine such as pyridine.

Preferred basic compounds (C) include compounds presented by the formula (C1) to the formula (C8) as described below. Among these, the basic compound presented by the formula (C1-1) is more preferable.

(C1)

wherein $R^{c1}$, $R^{c2}$ and $R^{c3}$ independently represent a hydrogen atom, a $C_1$ to $C_6$ alkyl group, $C_5$ to $C_{10}$ alicyclic hydrocarbon group or a $C_6$ to $C_{10}$ aromatic hydrocarbon group, one or more hydrogen atom contained in the alkyl group and alicyclic hydrocarbon group may be replaced by a hydroxy group, an amino group or a $C_1$ to $C_6$ alkoxyl group, one or more hydrogen atom contained in the aromatic hydrocarbon group may be replaced by a $C_1$ to $C_6$ alkyl group, a $C_1$ to $C_6$ alkoxyl group, a $C_5$ to $C_{10}$ alicyclic hydrocarbon group or a $C_6$ to $C_{10}$ aromatic hydrocarbon group.

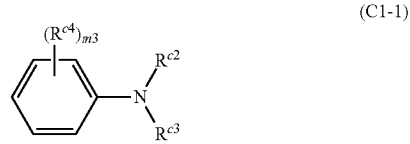
(C1-1)

wherein $R^{c2}$ and $R^{c3}$ have the same definition of the above;

$R^{c4}$ in each occurrence represents a $C_1$ to $C_6$ alkyl group, a $C_1$ to $C_6$ alkoxyl group, a $C_5$ to $C_{10}$ alicyclic hydrocarbon group or a $C_6$ to $C_{10}$ aromatic hydrocarbon group;

m3 represents an integer 0 to 3.

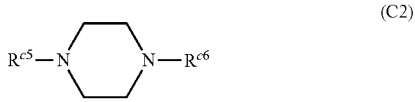
(C2)

(C3)

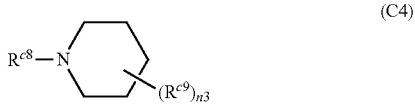
(C4)

wherein $R^{c5}$, $R^{c6}$, $R^{c7}$ and $R^{c8}$ independently represent the any of the group as described in $R^{c1}$ of the above;

$R^{c9}$ in each occurrence independently represents a $C_1$ to $C_6$ alkyl group, a $C_3$ to $C_6$ alicyclic hydrocarbon group or a $C_2$ to $C_6$ alkanoyl group;

n3 represents an integer of 0 to 8.

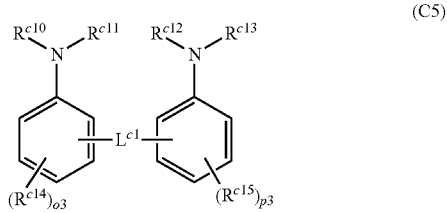
(C5)

(C6)

wherein $R^{c10}$, $R^{c11}$, $R^{c12}$, $R^{c13}$ and $R^{c16}$ independently represent the any of the groups as described in $R^{c1}$;

$R^{c14}$, $R^{c15}$ and $R^{c17}$ in each occurrence independently represent the any of the groups as described in $R^{c4}$;

o3 and p3 represent an integer of 0 to 3;

$L^{c1}$ represents a divalent $C_1$ to $C_6$ alkanediyl group, —CO—, —C(=NH)—, —S— or a combination thereof.

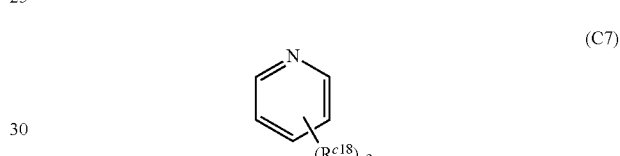
(C7)

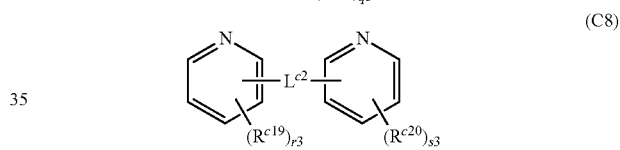
(C8)

wherein $R^{c18}$, $R^{c19}$ and $R^{c20}$ in each occurrence independently represent the any of the groups as described in $R^{c4}$;

q3, r3 and s3 represent an integer of 0 to 3;

$L^{c2}$ represents a single bond, a $C_1$ to $C_6$ alkanediyl group, —CO—, —C(=NH)—, —S— or a combination thereof.

In the above formulae, examples of the alkyl group, the alicyclic group, the aromatic group, alkoxy group and the alkanediyl group are the same examples described above.

Examples of the alkanoyl group include acetyl group, 2-methylacetyl group, 2,2-dimethylacetyl group, propionyl group, butylyl group, isobutylyl group, pentanoyl group, and 2,2-dimethylpropionyl group.

Specific examples of the amine represented by the formula (C1) include 1-naphtylamine and 2-naphtylamine, aniline, diisopropylaniline, 2-, 3- or 4-methylaniline, 4-nitroaniline, N-methylaniline, N,N-dimethylaniline, diphenylamine, hexylamine, heptylamine, octylamine, nonylamine, decylamine, dibutylamine, dipentylamine, dihexylamine, diheptylamine, dioctylamine, dinonylamine, didecylamine, triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethyldipentylamine, ethyldihexylamine, ethyldiheptylamine, ethyldioctylamine, ethyldinonylamine, ethyldidecylamine, dicyclohexylmethylamine, tris[2-(2-methoxyethoxy)ethyl]amine, triisopropanolamine, ethylene diamine, tetramethylene diamine, hexamethylene diamine, 4,4'-diamino-1,2-diphenylethane, 4,4'-diamino-3,3'-dimethyldiphenylmethane and 4,4'-diamino-3,3'-diethyldiphenylmethane.

Among these, diisopropylaniline is preferable, particularly 2,6-diisopropylaniline is more preferable as the basic compounds (C) contained in the present resist composition.

Specific examples of the compound represented by the formula (C2) include, for example, piperadine.

Specific examples of the compound represented by the formula (C3) include, for example, morpholine.

Specific examples of the compound represented by the formula (C4) include, for example, piperidine, a hindered amine compound having piperidine skeleton described in JP H11-52575A.

Specific examples of the compound represented by the formula (C5) include, for example, 2,2'-methylenebisaniline.

Specific examples of the compound represented by the formula (C6) include, for example, imidazole and 4-methylimidazole.

Specific examples of the compound represented by the formula (C7) include, for example, pyridine and 4-methylpyridine.

Specific examples of the compound represented by the formula (C8) include, for example, 1,2-di(2-pyridyl)ethane, 1,2-di(4-pyridyl)ethane, 1,2-di(2-pyridyl)ethene, 1,2-di(4-pyridyl)ethene, 1,3-di(4-pyridyl)propane, 1,2-di(4-pyridyloxy)ethane, di(2-pyridyl)ketone, 4,4'-dipyridyl sulfide, 4,4'-dipyridyl disulfide, 2,2'-dipyridylamine, 2,2'-dipicolylamine and bipyridine.

Examples of the ammonium salt include tetramethylammonium hydroxide, tetraisopropylammonium hydroxide, tetrabutylammonium hydroxide, tetrahexylammonium hydroxide, tetraoctylammonium hydroxide, phenyltrimethyl ammonium hydroxide, 3-(trifluoromethyl)phenyltrimethylammonium hydroxide, tetra-n-butyl ammonium salicylate and choline.

The proportion of the basic compound (C) is preferably 0.01 to 5 weight %, more preferably 0.01 to 3 weight %, and still more preferably 0.01 to 1 weight % with respect to the total solid proportion of the resist composition.

<Other Ingredient (Hereinafter is Sometimes Referred to as "Other Ingredient (F)")>

The resist composition can also include small amounts of various additives such as sensitizers, dissolution inhibitors, surfactants, stabilizers, and dyes, as needed.

<Preparing the Resist Composition>

The present resist composition can be prepared by mixing the resin (A), the acid generator (B) and the compound (I), and the basic compound (C), the solvent (E), the acid generator other than the acid generator (B) and the other ingredient (F) as needed. There is no particular limitation on the order of mixing. The mixing may be performed in an arbitrary order. The temperature of mixing may be adjusted to an appropriate temperature within the range of 10 to 40° C., depending on the kinds of the resin and solubility in the solvent (E) of the resin. The time of mixing may be adjusted to an appropriate time within the range of 0.5 to 24 hours, depending on the mixing temperature. There is no particular limitation to the tool for mixing. An agitation mixing may be adopted.

After mixing the above ingredients, the present resist compositions can be prepared by filtering the mixture through a filter having about 0.003 to 0.2 µm pore diameter.

<Method for Producing Resist Pattern>

The method for producing a resist pattern of the present invention includes the steps of:

(1) applying the resist composition of the present invention onto a substrate;
(2) drying the applied composition to form a composition layer;
(3) exposing the composition layer;
(4) heating the exposed composition layer, and
(5) developing the heated composition layer.

Applying the resist composition onto the substrate can generally be carried out through the use of a resist application device, such as a spin coater known in the field of semiconductor microfabrication technique. The thickness of the applied resist composition layer can be adjusted by controlling the variable conditions of the resist application device. These conditions can be selected based on a pre-experiment carried out beforehand. The substrate can be selected from various substrates intended to be microfabricated. The substrate may be washed, and an organic antireflection film may be formed on the substrate by use of a commercially available antireflection composition, before the application of the resist composition.

Drying the applied composition layer, for example, can be carried out using a heating device such as a hotplate (so-called "prebake"), a decompression device, or a combination thereof. Thus, the solvent evaporates from the resist composition and a composition layer with the solvent removed is formed. The condition of the heating device or the decompression device can be adjusted depending on the kinds of the solvent used. The temperature in this case is generally within the range of 50 to 200° C. Moreover, the pressure is generally within the range of 1 to $1.0 \times 10^5$ Pa.

The composition layer thus obtained is generally exposed using an exposure apparatus or a liquid immersion exposure apparatus. The exposure is generally carried out through a mask that corresponds to the desired pattern. Various types of exposure light source can be used, such as irradiation with ultraviolet lasers such as KrF excimer laser (wavelength: 248 nm), ArF excimer laser (wavelength: 193 nm), $F_2$ excimer laser (wavelength: 157 nm), or irradiation with far-ultraviolet wavelength-converted laser light from a solid-state laser source (YAG or semiconductor laser or the like), or vacuum ultraviolet harmonic laser light or the like. Also, the exposure device may be one which irradiates electron beam or extreme-ultraviolet light (EUV).

After exposure, the composition layer is subjected to a heat treatment (so-called "post-exposure bake") to promote the deprotection reaction. The heat treatment can be carried out using a heating device such as a hotplate. The heating temperature is generally in the range of 50 to 200° C., preferably in the range of 70 to 150° C.

The composition layer is developed after the heat treatment, generally with an alkaline developer and using a developing apparatus. The development here means to bring the composition layer after the heat treatment into contact with an alkaline solution. Thus, the exposed portion of the composition layer is dissolved by the alkaline solution and removed, and the unexposed portion of the composition layer remains on the substrate, whereby producing a resist pattern. Here, as the alkaline developer, various types of aqueous alkaline solutions used in this field can be used. Examples include aqueous solutions of tetramethylammonium hydroxide and (2-hydroxyethyl)trimethylammonium hydroxide (common name: choline).

After the development, it is preferable to rinse the substrate and the pattern with ultrapure water and to remove any residual water thereon.

<Application>

The resist composition of the present invention is useful as the resist composition for excimer laser lithography such as with ArF, KrF or the like, and the resist composition for electron beam (EB) exposure lithography and extreme-ultraviolet (EUV) exposure lithography, as well as liquid immersion exposure lithography.

The resist composition of the present invention can be used in semiconductor microfabrication and in manufacture of liquid crystals, thermal print heads for circuit boards and the like, and furthermore in other photofabrication processes, which can be suitably used in a wide range of applications.

EXAMPLES

The present invention will be described more specifically by way of examples, which are not construed to limit the scope of the present invention.

All percentages and parts expressing the content or amounts used in the Examples and Comparative Examples are based on weight, unless otherwise specified.

The composition ratio of the resin (the copolymerization ratio of the structural unit derived from each monomer used in the preparation with respect to the resin) was calculated by measuring the amount of the unreacted monomer in the reacted solution after the completion of the reaction through liquid chromatography, and calculating the amount of the monomer use in the polymerization from the obtained results.

The weight average molecular weight is a value determined by gel permeation chromatography.

Column: TSK gel Multipore HXL-M×3+guardcolumn (Tosoh Co. Ltd.)
Eluant: tetrahydrofuran
Flow rate: 1.0 mL/min
Detecting device: RI detector
Column temperature: 40° C.
Injection amount: 100 μL
Standard material for calculating molecular weight: standard polysthylene (Toso Co. ltd.)

Synthesis Example 1

Synthesis of a Salt Represented by the Formula (II-1)

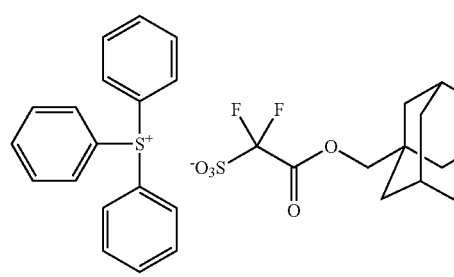

(II-1-a)

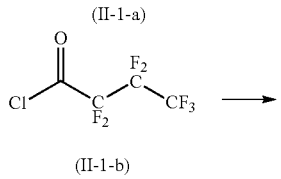

(II-1-b)

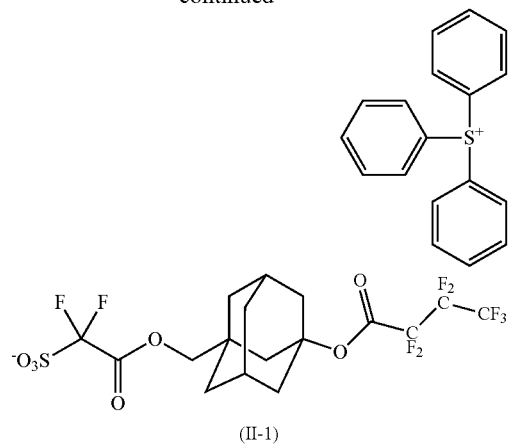

(II-1)

A salt represented by the formula (II-1-a) was synthesized by the method described in Example 2 of JP2006-257078A.

3.00 parts of the salt represented by the formula (II-1-a), 30.00 parts of chloroform and 0.85 parts of N-methylpyrrolidine were charged, and stirred for 30 minutes at 0° C. To the obtained mixture, 1.74 parts of a compound represented by the formula (II-1-b) was added and stirred for 30 minutes at 0° C. To the obtained mixture, 150 parts of chloroform and 40 parts of 5% oxalic acid solution were added, stirred, and separated to obtain an organic layer. To the obtained organic layer, 50 parts of ion-exchanged water was added, stirred, and separated to obtain an organic layer. This washing with water operation was repeated five times. To the obtained organic layer, 100 parts of an activated carbon was added, stirred for 30 minutes at 23° C., and filtrated. The filtrate was concentrated to obtain a concentrate. To the concentrate, 10 parts of acetonitrile was added to dissolve the concentrate, and the obtained solution was concentrated to obtain a concentrate. To the concentrate, 20 parts of ethyl acetate was added, stirred and a supernatant was removed. 20 parts of tert-butyl methyl ether was added to the obtained residue, stirred and a supernatant was removed. To the obtained residue, chloroform was added to dissolve, and the obtained solution was concentrated, whereby giving 2.19 parts of the salt represented by the formula (II-1).

MS (ESI(+) Spectrum): M⁺ 263.1
MS (ESI(−) Spectrum): M⁻ 535.1

Synthesis Example 2

Synthesis of a Salt Represented by the Formula (II-9)

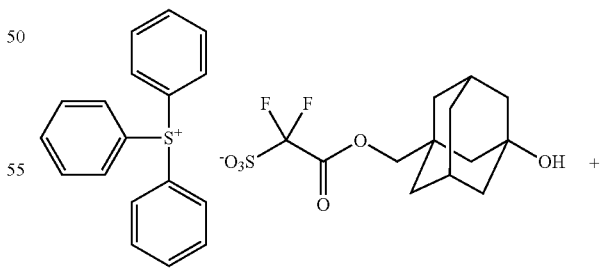

(II-9-a)

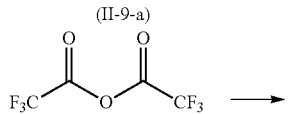

(II-9-b)

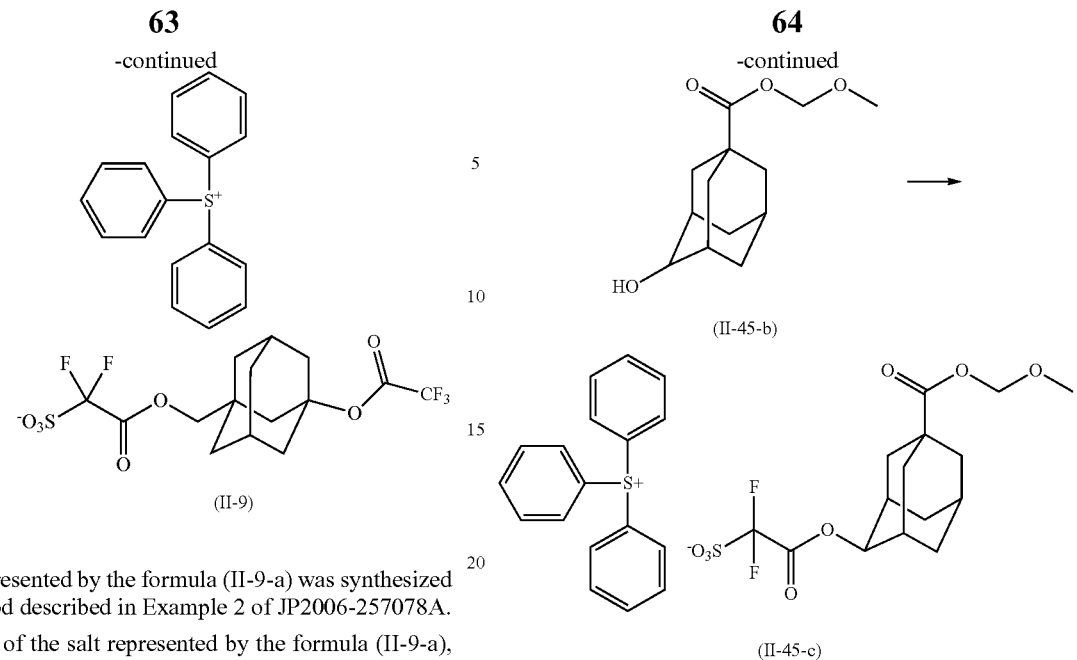

(II-9)

A salt represented by the formula (II-9-a) was synthesized by the method described in Example 2 of JP2006-257078A.

3.00 parts of the salt represented by the formula (II-9-a), 30.00 parts of chloroform and 0.85 parts of N-methylpyrrolidine were charged, and stirred for 30 minutes at 0° C. To the obtained mixture, 1.57 parts of a compound represented by the formula (II-9-b) was added and stirred for 30 minutes at 0° C. To the obtained mixture, 150 parts of chloroform and 40 parts of 5% oxalic acid solution were added, stirred, and separated to obtain an organic layer. To the obtained organic layer, 50 parts of ion-exchanged water was added, stirred, and separated to obtain an organic layer. This washing with water operation was repeated five times. To the obtained organic layer, 100 parts of an activated carbon was added, stirred for 30 minutes at 23° C., and filtrated. The filtrate was concentrated to obtain a concentrate. To the concentrate, 10 parts of acetonitrile was added to dissolve the concentrate, and the obtained solution was concentrated to obtain a concentrate. To the concentrate, 20 parts of ethyl acetate was added, stirred and a supernatant was removed. 20 parts of tert-butyl methyl ether was added to the obtained residue, stirred and a supernatant was removed. To the obtained residue, chloroform was added to dissolve, and the obtained solution was concentrated, whereby giving 1.84 parts of the salt represented by the formula (II-9).

MS (ESI(+) Spectrum): M⁺ 263.1

MS (ESI(−) Spectrum): M⁻ 435.1

Synthesis Example 3

Synthesis of a Salt Represented by the Formula (II-45)

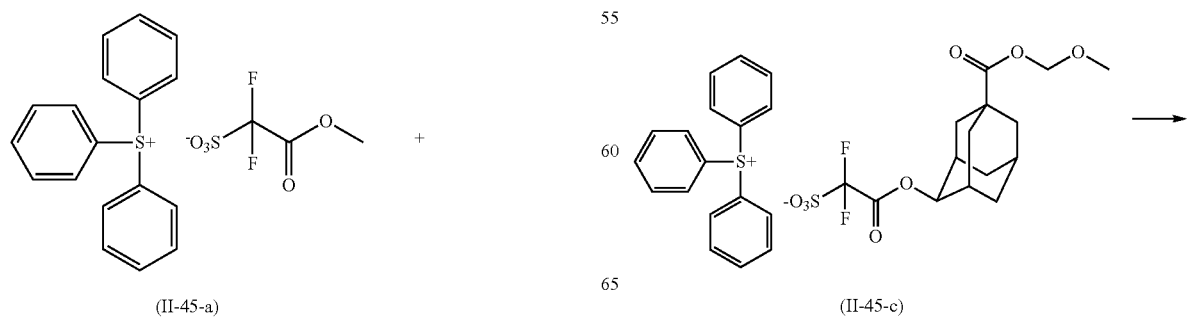

10.00 parts of a salt represented by the formula (II-45-a) and 80.00 parts of chloroform was charged, stirred to dissolve. To the obtained solution, 7.97 parts of a compound represented by the formula (1'-45-b) was added, and then 0.15 parts of lithium amide was added, and stirred for 30 minutes at 23° C. To the obtained mixture, 13.00 parts of a molecular sieve (5A; Wako Pure Chemical Industries, Ltd.) was added, stirred, and heated for 8 hours at 60° C. The obtained mixture wad cooled to 23° C., filtrated to obtain a filtrate. To the filtrate, 24.53 parts of ion-exchanged water was added, stirred and separated to obtain an organic layer. The obtained organic layer was washed with water for 2 times. And then, to the obtained organic layer was added 1.33 parts of an activated carbon, stirred, and filtrated. The obtained filtrate was concentrated, whereby giving 20.20 parts of light yellow oil. To the obtained 20.20 parts of light yellow oil, 60.60 parts of acetonitrile was added to dissolve, the obtained solution was concentrated, and 81.80 parts of ethyl acetate was added thereto. The obtained solution was concentrated, and 76.60 parts of methyl-tert-butyl ether was added thereto, the obtained mixture was stirred, the obtained supernatant was removed to collect a lower layer, the obtained layer was concentrated. To the obtained concentrate, 66.00 parts of ethyl acetate was added, stirred, the obtained supernatant was removed to collect a lower layer. The obtained layer was concentrated, whereby giving 11.96 parts of a salt represented by the formula (II-45-c).

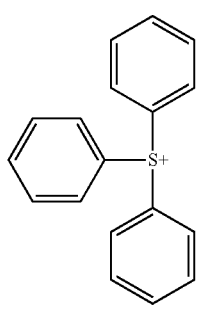
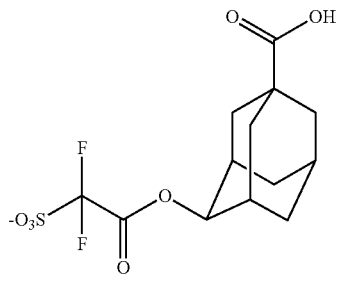

(II-45-d)

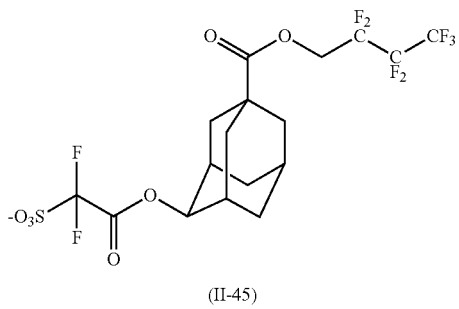

(II-45)

6.60 parts of the salt represented by the formula (II-45-c), 40.00 parts of the chloroform, 7.70 parts of 1N hydrochloride and 7.70 parts of methanol was added to obtain a mixture, the mixture was stirred for 15 hours at 23° C. Thereafter, 40 parts of 1N sodium bicarbonate solution was added thereto, stirred and separated to obtain an organic layer. To the obtained organic layer, 40 parts of ion-exchanged water was added, stirred and separated to obtain an organic layer. The obtained organic was washed with water for three times. To the obtained organic layer, 100 parts of an activated carbon was added, stirred, and filtrated. The filtrate was concentrated, whereby giving 7.71 parts of the salt represented by the formula (II-45-d).

3.09 parts of the salt represented by the formula (II-45-d), 15.50 parts of acetonitrile and 0.89 parts of carbonyl diimidazole were charged, and stirred for 2 hours at 50° C. The obtained mixture was cooled to 40° C., a solution of 1.00 parts of a compound represented by the formula (II-45-e) dissolved in 9.00 parts of acetonitrile was added in the form of drops thereto, reacted for 3 hours at 40° C. Then the obtained reactant was cooled, and 30 parts of chloroform and 30 parts of ion-exchanged water were added to the reactant, stirred, and separated to obtain an organic layer. To the obtained organic layer, 30 parts of ion-exchanged water was added to repeat washes with water until the aqueous layer was neutralized. To the obtained organic layer, 100 parts of an activated carbon was added, stirred and filtrated. The filtrate was concentrated to obtain a concentrate. To the concentrate, 10 parts of acetonitrile was added to dissolve the concentrate, and a supernatant obtained was removed. To the obtained residue, 10 parts of tert-butyl methyl ether was added, stirred and a supernatant was removed. To the obtained residue, chloroform was added to dissolve, and the obtained solution was concentrated, whereby giving 2.24 parts of the salt represented by the formula (II-45).

MS (ESI(+) Spectrum): M$^+$ 263.1

MS (ESI(−) Spectrum): M$^-$ 535.1

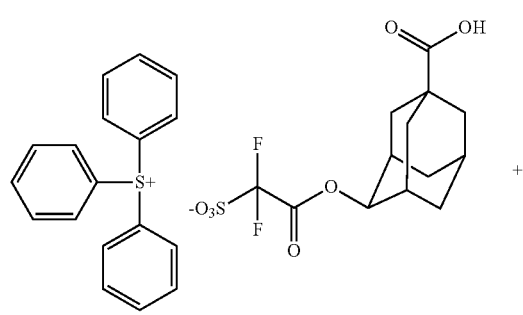

(II-45-d)

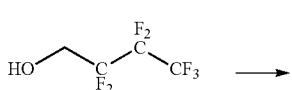

(II-45-e)

Synthetic Example of the Resin

The monomers used the synthesis of the resin are shown below.

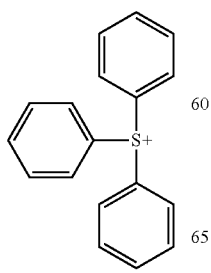

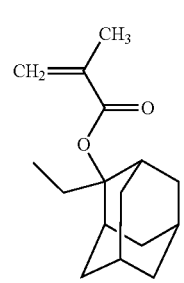

(A)

(B) 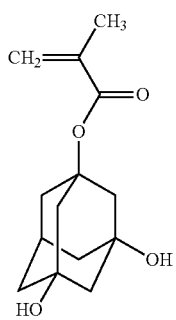

(C) 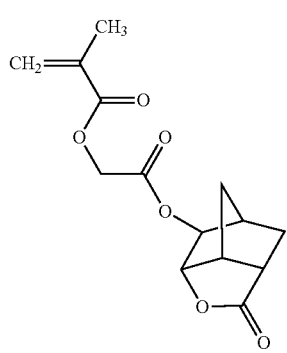

(D) 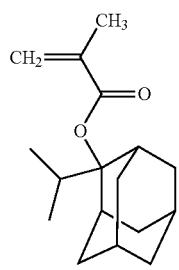

(E) 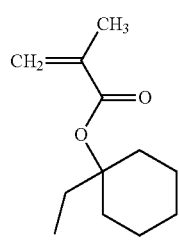

(F) 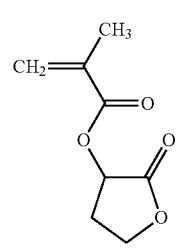

(G) 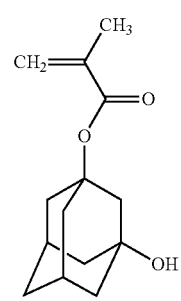

(H) 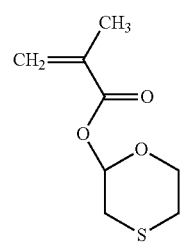

(I) 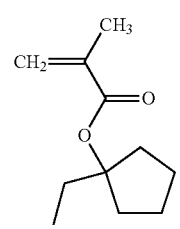

These monomers are referred to as "monomer (A)" to "monomer (I)".

Synthetic Example

Synthesis of Resin A1

Monomer (D), monomer (E), monomer (B), monomer (C) and monomer (F) were mixed together with a mole ratio of monomer (D):monomer (E):monomer (B):monomer (C):monomer (F)=50:5:4:33:8, and dioxane was added thereto in an amount equal to 1.2 times by weight of the total amount of monomers to obtain a solution. Azobisisobutyronitrile and azobis(2,4-dimethylvaleronitrile) was added as an initiator to obtain a solution in an amount of 1.8 mol % and 5.4 mol % respectively with respect to the entire amount of monomers, and the resultant mixture was heated for about 5 hours at 75° C. After that, the obtained reacted mixture was poured into a mixture of a large amount of methanol and water to precipitate a resin. The obtained resin was filtrated. Thus obtained resin was dissolved in another dioxane to obtain a solution, and the solution was poured into a large amount of a mixture of methanol and water to precipitate a resin. The obtained resin was filtrated. These operations were repeated two times, resulting in a 71% yield of copolymer having a weight average molecular weight of about 4700. This copolymer, which had the structural units of the following formula, was referred to Resin A1. The mole ratio of each structural unit is structural unit (D):structural unit (E):structural unit (B):structural unit (C):structural unit (F)=40.6:5.1:4.8:39.7:9.8.

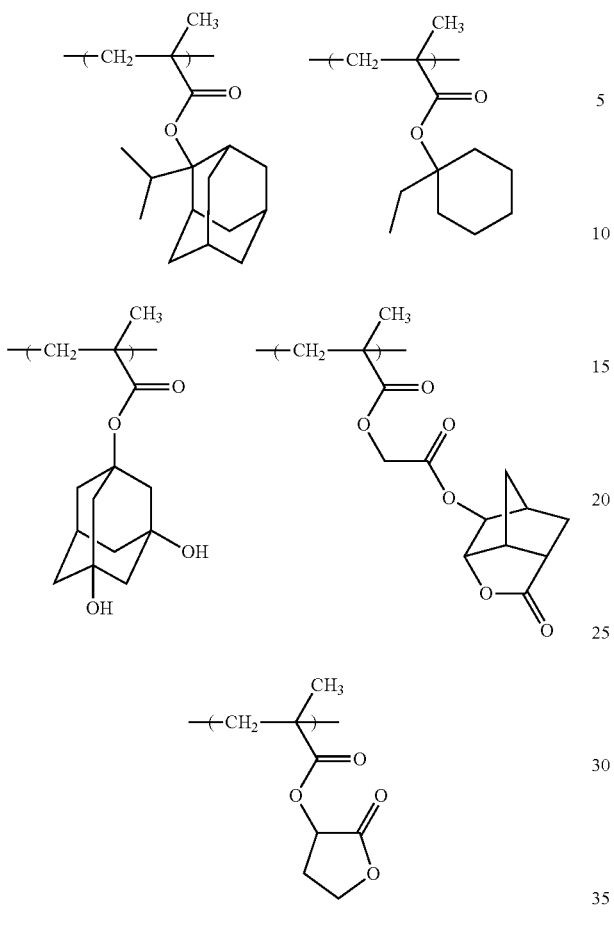

Synthetic Example

Synthesis of Resin A2

Monomer (A), monomer (E), monomer (G), monomer (C) and monomer (F) were mixed together with a mole ratio of monomer (A):monomer (E):monomer (G):monomer (C):monomer (F)=45:5:9:33:8, and dioxane was added thereto in an amount equal to 1.2 times by weight of the total amount of monomers to obtain a solution. Azobisisobutyronitrile and azobis(2,4-dimethylvaleronitrile) was added as an initiator to obtain a solution in an amount of 2.0 mol % and 6.0 mol % respectively with respect to the entire amount of monomers, and the resultant mixture was heated for about 5 hours at 75° C. After that, the obtained reacted mixture was poured into a mixture of a large amount of methanol and water to precipitate a resin. The obtained resin was filtrated. Thus obtained resin was dissolved in another dioxane to obtain a solution, and the solution was poured into a large amount of a mixture of methanol and water to precipitate a resin. The obtained resin was filtrated. These operations were repeated three times, resulting in a 80% yield of copolymer having a weight average molecular weight of about 4200. This copolymer, which had the structural units of the following formula, was referred to Resin A2. The mole ratio of each structural unit is structural unit (A):structural unit (E):structural unit (G):structural unit (C):structural unit (F)=35.2:5.4:9.8:39.8:9.8.

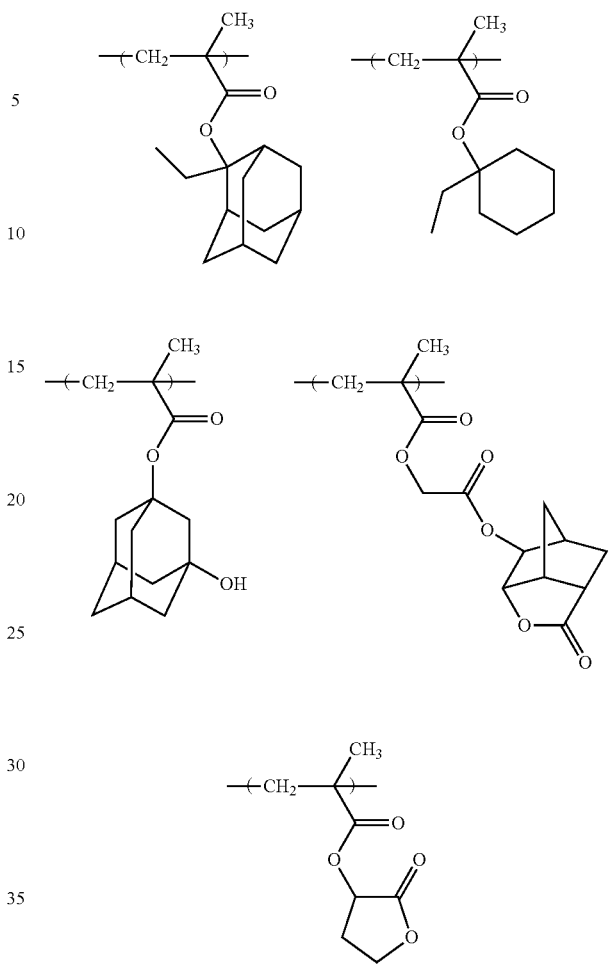

Synthetic Example

Synthesis of Resin A3

Monomer (A), monomer (G) and monomer (F) were mixed together with a mole ratio of monomer (A):monomer (G):monomer (F)=50:25:25, and dioxane was added thereto in an amount equal to 1.5 times by weight of the total amount of monomers to obtain a solution. Azobisisobutyronitrile and azobis(2,4-dimethylvaleronitrile) was added as an initiator to obtain a solution in an amount of 1.0 mol % and 3.0 mol % respectively with respect to the entire amount of monomers, and the resultant mixture was heated for about 8 hours at 80° C. After that, the obtained reacted mixture was poured into a mixture of a large amount of methanol and water to precipitate a resin. The obtained resin was filtrated. Thus obtained resin was dissolved in another dioxane to obtain a solution, and the solution was poured into a mixture of methanol and water to precipitate a resin. The obtained resin was filtrated. These operations were repeated three times, resulting in a 60% yield of copolymer having a weight average molecular weight of about 9200. This copolymer, which had the structural units of the following formula, was referred to Resin A3.

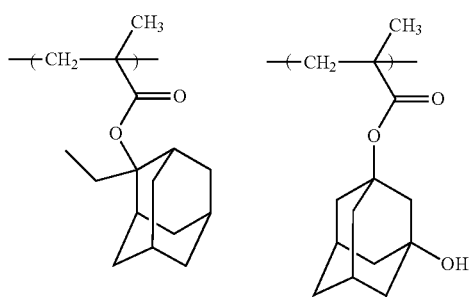

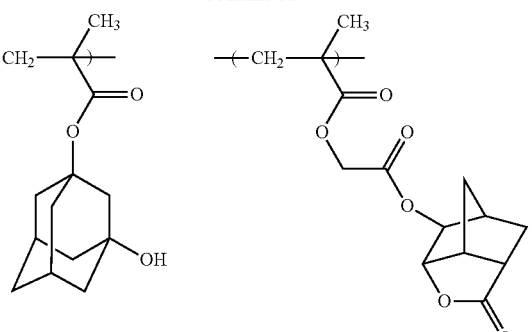
-continued

Synthetic Example

Synthesis of Resin A4

Monomer (D), monomer (E), monomer (G), monomer (C) and monomer (F) were mixed together with a mole ratio of monomer (D):monomer (E):monomer (G):monomer (C):monomer (F)=30:14:6:20:30, and dioxane was added thereto in an amount equal to 1.5 times by weight of the total amount of monomers to obtain a solution. Azobisisobutyronitrile and azobis(2,4-dimethylvaleronitrile) was added as an initiator to obtain a solution in an amount of 1 mol % and 3 mol % respectively with respect to the entire amount of monomers, and the resultant mixture was heated for about 5 hours at 75° C. After that, the obtained reacted mixture was poured into a mixture of a large amount of methanol and water to precipitate a resin. The obtained resin was filtered. Thus obtained resin was dissolved in another dioxane to obtain a solution, and the solution was poured into a large amount of a mixture of methanol and water to precipitate a resin. The obtained resin was filtrated. These operations were repeated two times, resulting in a 60% yield of copolymer having a weight average molecular weight of about 7000. This copolymer, which had the structural units of the following formula, was referred to Resin A4.

Synthetic Example

Synthesis of Resin A5

Monomer (D), monomer (H), monomer (G), monomer (C) and monomer (F) were mixed together with a mole ratio of monomer (D):monomer (H):monomer (G):monomer (C):monomer (F)=30:14:6:20:30, and dioxane was added thereto in an amount equal to 1.5 times by weight of the total amount of monomers to obtain a solution. Azobisisobutyronitrile and azobis(2,4-dimethylvaleronitrile) was added as an initiator to obtain a solution in an amount of 1 mol % and 3 mol % respectively with respect to the entire amount of monomers, and the resultant mixture was heated for about 5 hours at 75° C. After that, the obtained reacted mixture was poured into a mixture of a large amount of methanol and water to precipitate a resin. The obtained resin was filtered. Thus obtained resin was dissolved in another dioxane to obtain a solution, and the solution was poured into a large amount of a mixture of methanol and water to precipitate a resin. The obtained resin was filtrated. These operations were repeated two times, resulting in a 62% yield of copolymer having a weight average molecular weight of about 7400. This copolymer, which had the structural units of the following formula, was referred to Resin A5.

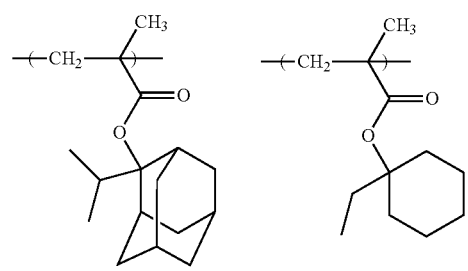

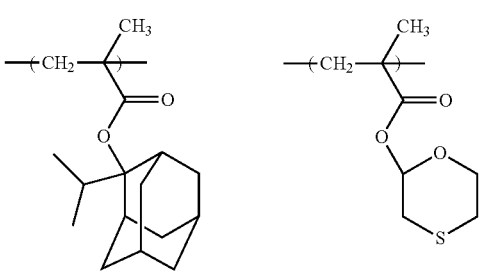

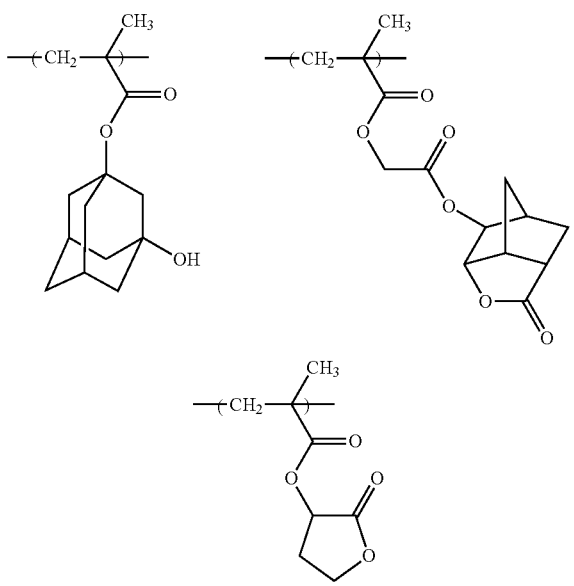

Synthetic Example

Synthesis of Resin A6

Monomer (D), monomer (I), monomer (G), monomer (C) and monomer (F) were mixed together with a mole ratio of monomer (D):monomer (I):monomer (G):monomer (C): monomer (F)=30:14:6:20:30, and dioxane was added thereto in an amount equal to 1.5 times by weight of the total amount of monomers to obtain a solution. Azobisisobutyronitrile and azobis(2,4-dimethylvaleronitrile) was added as an initiator to obtain a solution in an amount of 1 mol % and 3 mol % respectively with respect to the entire amount of monomers, and the resultant mixture was heated for about 5 hours at 75° C. After that, the obtained reacted mixture was poured into a mixture of a large amount of methanol and water to precipitate a resin. The obtained resin was filtrated. Thus obtained resin was dissolved in another dioxane to obtain a solution, and the solution was poured into a large amount of a mixture of methanol and water to precipitate a resin. The obtained resin was filtrated. These operations were repeated two times, resulting in a 68% yield of copolymer having a weight average molecular weight of about 8200. This copolymer, which had the structural units of the following formula, was referred to Resin A6.

Synthetic Example

Synthesis of Resin A7

Monomer (D), monomer (I), monomer (B), monomer (C) and monomer (F) were mixed together with a mole ratio of monomer (D):monomer (I):monomer (B):monomer (C): monomer (F)=30:15:3:27:20, and dioxane was added thereto in an amount equal to 1.5 times by weight of the total amount of monomers to obtain a solution. Azobisisobutyronitrile and azobis(2,4-dimethylvaleronitrile) was added as an initiator to obtain a solution in an amount of 1 mol % and 3 mol % respectively with respect to the entire amount of monomers, and the resultant mixture was heated for about 5 hours at 75° C. After that, the obtained reacted mixture was poured into a mixture of a large amount of methanol and water to precipitate a resin. The obtained resin was filtrated. Thus obtained resin was dissolved in another dioxane to obtain a solution, and the solution was poured into a large amount of a mixture of methanol and water to precipitate a resin. The obtained resin was filtrated. These operations were repeated two times, resulting in a 73% yield of copolymer having a weight average molecular weight of about 7900. This copolymer, which had the structural units of the following formula, was referred to Resin A7.

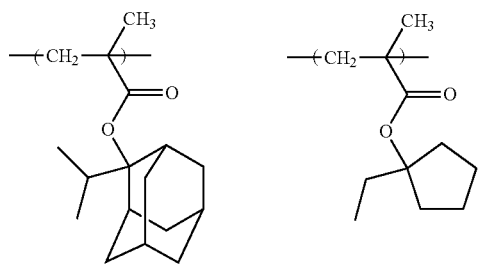
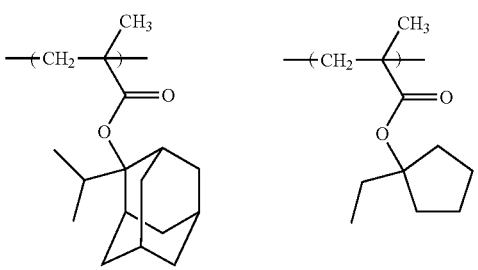

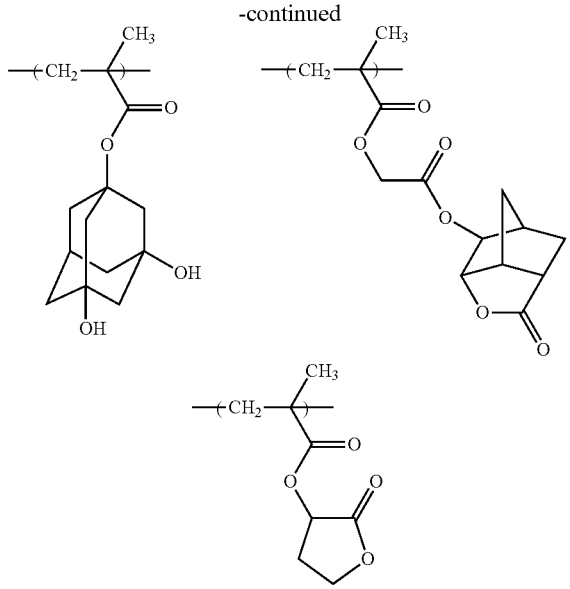

(Preparing Resist Composition)

Resist compositions were prepared by mixing and dissolving each of the components shown in Table 2, and then filtrating through a fluororesin filter having 0.2 μm pore diameter.

TABLE 2

(Unit: parts)

| | Resin | Acid Generator | Compound (I) | Basic Compound | BP/PEB (° C./° C.) |
|---|---|---|---|---|---|
| Ex. | | | | | |
| 1 | A1 = 10 | II-1 = 1.2 | D1 = 0.1 | — | 95/85 |
| 2 | A2 = 10 | II-1 = 1.2 | D1 = 0.1 | — | 110/105 |
| 3 | A1 = 10 | II-1/B1 = 0.6/0.6 | D1 = 0.1 | — | 95/85 |
| 4 | A3 = 10 | II-1 = 1.2 | D1 = 0.1 | — | 110/105 |
| 5 | A4 = 10 | II-1 = 1.2 | D1 = 0.1 | — | 95/85 |
| 6 | A5 = 10 | II-1 = 1.2 | D1 = 0.1 | — | 95/85 |
| 7 | A5 = 10 | II-9 = 1.2 | D1 = 0.1 | — | 95/85 |
| 8 | A5 = 10 | II-45 = 1.2 | D1 = 0.1 | — | 95/85 |
| 9 | A6 = 10 | II-1 = 1.2 | D1 = 0.1 | — | 95/85 |
| 10 | A7 = 10 | II-1 = 1.2 | D1 = 0.1 | — | 95/85 |
| Comparative Ex. | | | | | |
| 1 | A3 = 10 | B2 = 1.2 | — | C1 = 0.1 | 110/105 |

<Resin>
Resin prepared by the Synthetic Examples, A1 to A7
<Acid Generator>

II-1:

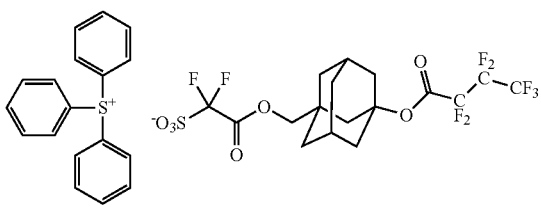

50 mg of this acid generator (II-1) was dissolved in 0.7924 g of dimethyl sulfoxide, 0.25 g of 2.38 wt % tetramethylammonium hydroxide solution was added thereto, and stirred for 1 hour at 23° C. After that, decomposed substance of the acid generator (II-1) was analyzed. As a result of decomposition, a compound described below was observed by cleaving the basic dissociable group.

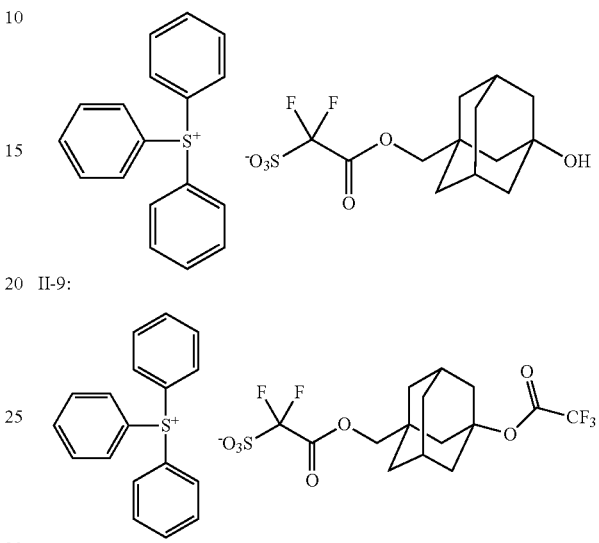

II-9:

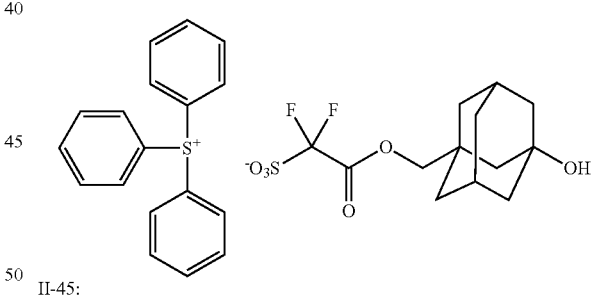

50 mg of this acid generator (II-9) was dissolved in 0.7924 g of dimethyl sulfoxide, 0.25 g of 2.38 wt % tetramethylammonium hydroxide solution was added thereto, and stirred for 1 hour at 23° C. After that, decomposed substance of the acid generator (II-9) was analyzed. As a result of decomposition, a compound described below was observed by cleaving the basic dissociable group.

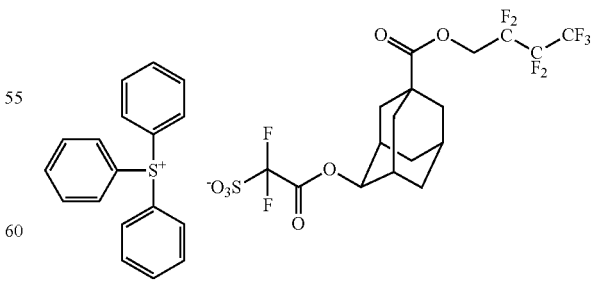

II-45:

50 mg of this acid generator (II-45) was dissolved in 0.7924 g of dimethyl sulfoxide, 0.25 g of 2.38 wt % tetramethylammonium hydroxide was added thereto, and stirred for 1 hour at 23° C. After that, decomposed substance of the acid generator (II-45) was analyzed. As a result of decomposition, a compound described below was observed by cleaving the basic dissociable group.

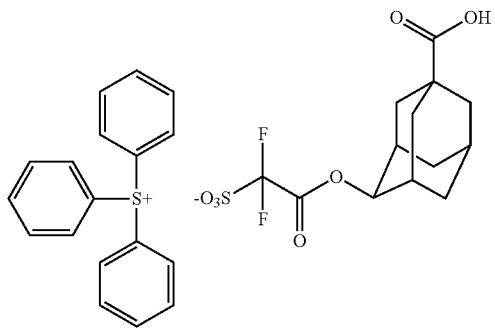

B1: this was prepared by a method according to the method described in the Examples of JP2010-152341A.

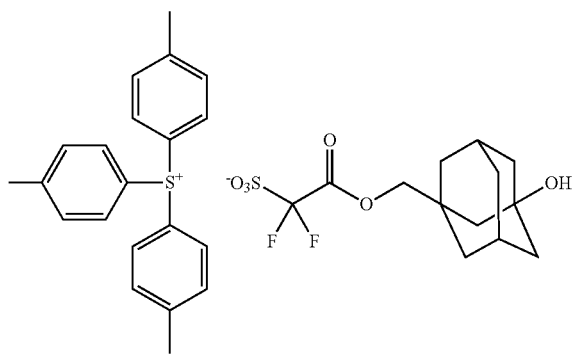

50 mg of this acid generator B1 was dissolved in 0.7966 g of dimethyl sulfoxide, 0.25 g of 2.38 wt % tetramethylammonium hydroxide solution was added thereto, and stirred for 1 hour at 23° C. After that, decomposed substance of the acid generator B1 was analyzed. As a result of decomposition of the acid generator B1 was not observed.

B2: this was prepared by a method according to the method described in the Examples of JP2007-161707A

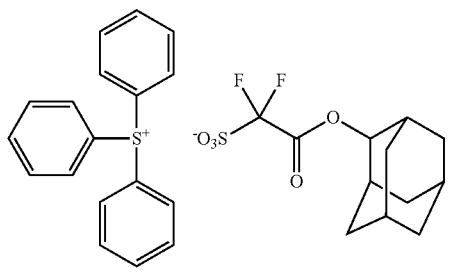

50 mg of this acid generator B2 was dissolved in 0.7999 g of dimethyl sulfoxide, 0.25 g of 2.38 wt % tetramethylammonium hydroxide solution was added thereto, and stirred for 1 hour at 23° C. After that, decomposed substance of the acid generator B1 was analyzed. As a result of decomposition of the acid generator B2 was not observed.

<Basic Compound: Qencher>
C1: 2,6-diisopropylaniline (obtained from Tokyo Chemical Industry Co., LTD)
<Compound (I)>
E1: obtained from Tokyo Chemical Industry Co., LTD

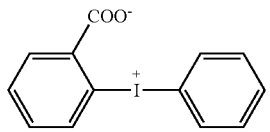

| <Solvent of Resist composition> | |
|---|---|
| Propylene glycol monomethyl ether acetate | 265 parts |
| Propylene glycol monomethyl ether | 20 parts |
| 2-Heptanone | 20 parts |
| γ-butyrolactone | 3.5 parts |

(Producing Resist Pattern)

A composition for an organic antireflective film ("ARC-29", by Nissan Chemical Co. Ltd.) was applied onto 12-inch silicon wafers and baked for 60 seconds at 205° C. to form a 78 nm thick organic antireflective film.

The above resist compositions were then applied thereon by spin coating so that the thickness of the resulting film became 85 nm after drying.

The obtained wafers were then pre-baked for 60 sec on a direct hot plate at the temperatures given in the "PB" column in Table 2.

Contact hole patterns (hole pitch: 100 nm, hole diameter: 70 nm) were then exposed through stepwise changes in exposure quantity using an ArF excimer laser stepper for immersion lithography ("XT: 1900Gi" by ASML Ltd.: NA=1.35, ¾ Annular, X-Y deflection), on the wafers on which the resist film had thus been formed. The ultrapure water was used for medium of immersion.

After the exposure, post-exposure baking was carried out by 60 seconds at the temperatures given in the "PEB" column in Table 2.

Then, puddle development was carried out with 2.38 wt % tetramethylammonium hydroxide aqueous solution for 60 seconds to obtain a resist pattern.

Each resist pattern is produced based on the resist composition using the mask pattern (hole pitch: 100 nm, hole diameter: 70 nm) as described above. The exposure amount at which a 55 nm-hole diameter is achieved in the pattern is defined as the effective sensitivity.

(Critical Dimension Uniformity (CDU) Evaluation)

The resist patterns were formed by the same method described above with the effective sensitivity. The hole diameter was measured 24 times per one hole, and an average of those was an average hole diameter. The standard deviation is obtained from the average hole diameter based on the population which is 400 values of the above average hole diameter within the same wafer.

a "∘∘" was given if the standard deviation is less than 1.85 nm, a "∘" was given if the standard deviation is 1.85 nm or more, and less than 2.00 nm, and an "x" was given if the standard deviation is 2.00 nm or more.

Table 3 illustrates the results thereof.

TABLE 3

| Ex. | CDU |
|---|---|
| 1 | ○○(1.33) |
| 2 | ○○(1.38) |
| 3 | ○○(1.35) |
| 4 | ○(1.88) |
| 5 | ○○(1.31) |
| 6 | ○○(1.29) |
| 7 | ○○(1.30) |
| 8 | ○○(1.39) |
| 9 | ○○(1.29) |
| 10 | ○○(1.69) |
| Comparative Ex. 1 | x(2.58) |

According to the resist composition of the present invention, it is possible to produce a resist pattern with excellent CDU when producing the resist pattern. Therefore, the present resist composition can be used for semiconductor microfabrication.

What is claimed is:

1. A resist composition comprising
(A) a resin being insoluble or poorly soluble in alkali aqueous solution, but becoming soluble in an alkali aqueous solution by the action of an acid, said resin comprising a structural unit derived from a monomer having an acid labile group represented by formula (a1-1), the formula (a1-2), or the formula (a1-5),

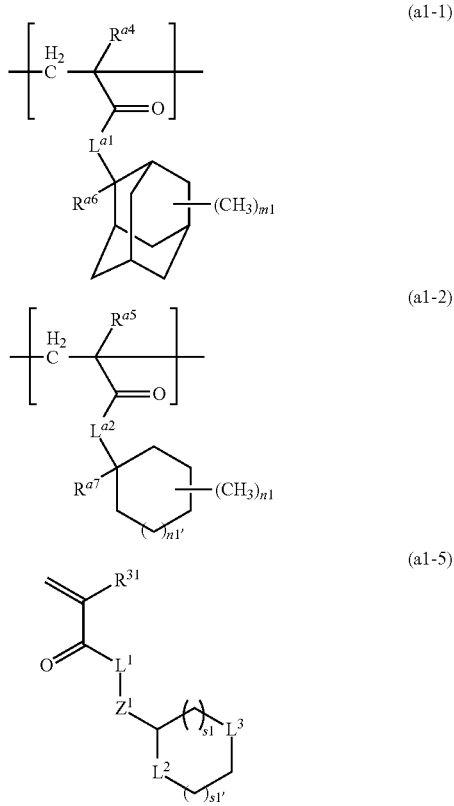

wherein $L^{a1}$ and $L^{a2}$ independently represent *—O— or *—O—(CH$_2$)$_{k1}$—CO—O—, k1 represents an integer of 1 to 7, * represents a bond to the carbonyl group;
$R^{a4}$ and $R^{a5}$ independently represent a hydrogen atom or a methyl group;
$R^{a6}$ and $R^{a7}$ independently represent a C$_1$ to C$_8$ alkyl group or a C$_3$ to C$_{10}$ alicyclic hydrocarbon group;
m1 represents an integer 0 to 14;
n1 represents an integer 0 to 10;
n1' represents an integer 0 to 3;
$R^{31}$ represents a hydrogen atom, a halogen atom or a C$_1$ to C$_6$ alkyl group that optionally has a halogen atom;
$L^1$ represents *—O—, *—S— or *—O—(CH$_2$)$_{k1}$—CO—O—, k1 represents an integer of 1 to 7, * represents a bond to the carbonyl group (—CO—);
$L^2$ and $L^3$ independently represent *—O— or *—S—;
s1 represents an integer of 0 to 4;
s1' represents an integer of 0 to 4;
$Z^1$ represents a single bond or a C$_1$ to C$_6$ alkanediyl group, and one or more —CH$_2$— contained in the alkanediyl group may be replaced by —O— or —CO—, (B) an acid generator having a structure to be cleaved by the action of an alkaline developer, wherein the structure is a group represented by the formula (Ba) or a group represented by the formula (Bb);

wherein $R^3$ represents a C$_1$ to C$_6$ alkyl group having a fluorine atom;

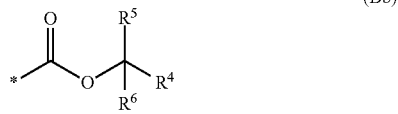

wherein $R^4$ represents a C$_1$ to C$_6$ alkyl group having a fluorine atom; and
$R^5$ and $R^6$ independently represent a hydrogen atom or a fluorine atom, and (C) a compound represented by the formula (I),

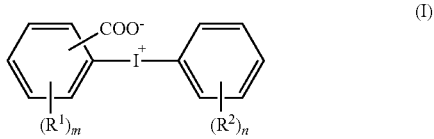

wherein $R^1$ and $R^2$ in each occurrence independently represent a C$_1$ to C$_{12}$ hydrocarbon group, a C$_1$ to C$_6$ alkoxyl group, a C$_2$ to C$_7$ acyl group, a C$_2$ to C$_7$ acyloxy group, a C$_2$ to C$_7$ alkoxycarbonyl group, a nitro group or a halogen atom;
m and n independently represent an integer of 0 to 4.

2. The resist composition according to claim 1, wherein the acid generator (B) is an acid generator represented by the formula (II-a) or an acid generator represented by the formula (II-b);

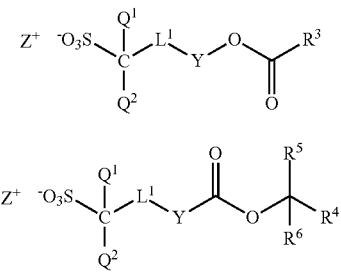

(II-a)

(II-b)

wherein $Q^1$ and $Q^2$ independently represent a fluorine atom or a $C_1$ to $C_6$ perfluoroalkyl group;

$L^1$ represents a single bond or a $C_1$ to $C_{17}$ alkanediyl group, and one or more —$CH_2$— contained in the alkanediyl group may be replaced by —O— or —CO—;

Y represents a $C_3$ to $C_{18}$ divalent alicyclic hydrocarbon group, and one or more —$CH_2$— contained in the alicyclic hydrocarbon group may be replaced by —O— or —CO;

$R^3$ represents a $C_1$ to $C_6$ alkyl group having a fluorine atom;

$R^4$ represents a $C_1$ to $C_6$ alkyl group having a fluorine atom;

$R^5$ and $R^6$ independently represent a hydrogen atom or a fluorine atom; and $Z^+$ represents an organic cation.

3. The resist composition according to claim 1, which further comprises a solvent.

4. A method for producing a resist pattern comprising steps of;
 (1) applying the resist composition of claim 1 onto a substrate;
 (2) drying the applied composition to form a composition layer;
 (3) exposing the composition layer;
 (4) heating the exposed composition layer, and
 (5) developing the heated composition layer.

* * * * *